(12) United States Patent
Nomura et al.

(10) Patent No.: US 8,405,292 B2
(45) Date of Patent: Mar. 26, 2013

(54) COLOR FILTER, METHOD OF MANUFACTURING THE SAME, AND LIGHT-EMITTING DEVICE

(75) Inventors: Yu Nomura, Miyagi (JP); Tatsuya Watanabe, Tokyo (JP); Hiroyuki Kiso, Miyagi (JP)

(73) Assignee: Sony Corporation, Tokyo (JP)

( * ) Notice: Subject to any disclaimer, the term of this patent is extended or adjusted under 35 U.S.C. 154(b) by 390 days.

(21) Appl. No.: 12/630,410

(22) Filed: Dec. 3, 2009

(65) Prior Publication Data

US 2010/0141116 A1 Jun. 10, 2010

(30) Foreign Application Priority Data

Dec. 5, 2008 (JP) ................. P2008-310510

(51) Int. Cl.
*H01J 5/16* (2006.01)
*H01J 61/40* (2006.01)
*H01K 1/26* (2006.01)
*H01K 1/30* (2006.01)

(52) U.S. Cl. ........ 313/114; 313/111; 313/112; 313/113; 313/501; 313/506; 362/241; 362/247; 362/293; 359/853; 359/868

(58) Field of Classification Search .......... 313/110–114, 313/498–512; 362/241, 247, 560, 293; 359/853, 359/868, 876
See application file for complete search history.

(56) References Cited

U.S. PATENT DOCUMENTS

| | | | | |
|---|---|---|---|---|
| 4,240,692 A | * | 12/1980 | Winston | 385/146 |
| 5,598,281 A | * | 1/1997 | Zimmerman et al. | 349/5 |
| 6,091,384 A | * | 7/2000 | Kubota et al. | 345/76 |
| 7,325,943 B2 | | 2/2008 | Benoit et al. | |
| 7,535,170 B2 | * | 5/2009 | Fujii | 313/506 |
| 7,572,037 B2 | * | 8/2009 | Fukuda et al. | 362/347 |
| 7,708,428 B2 | * | 5/2010 | Park et al. | 362/241 |
| 7,942,537 B2 | * | 5/2011 | Krijn et al. | 362/19 |
| 8,040,052 B2 | * | 10/2011 | Kobayashi | 313/506 |
| 2004/0080264 A1 | * | 4/2004 | Ichikawa | 313/501 |
| 2004/0084682 A1 | * | 5/2004 | Illek et al. | 257/80 |
| 2005/0140285 A1 | * | 6/2005 | Park et al. | 313/506 |
| 2005/0259198 A1 | * | 11/2005 | Lubart et al. | 349/113 |

(Continued)

FOREIGN PATENT DOCUMENTS

| | | |
|---|---|---|
| JP | 07-037688 | 2/1995 |
| JP | 11-074072 | 3/1999 |
| JP | 3573393 | 7/2004 |
| JP | 2005-531102 | 10/2005 |
| JP | 2007-248484 | 9/2007 |
| JP | 2007-305508 | 11/2007 |
| JP | 2008-218296 | 9/2008 |

OTHER PUBLICATIONS

Japanese Office Action issued Nov. 13, 2012 in corresponding Japanese Application No. 2008-310510.

*Primary Examiner* — Anne Hines
*Assistant Examiner* — Jose M Diaz
(74) *Attorney, Agent, or Firm* — K&L Gates LLP

(57) ABSTRACT

A color filter preventing the occurrence of cross-talk between colors while improving light extraction efficiency, a method of manufacturing the color filter, and a light-emitting device are provided. The color filter includes: a plurality of color filter layers for a plurality of colors arranged on a substrate, a plurality of projections arranged in contact with the color filter layers, the projections of which parts on a side closer to the color filter layers are connected to one another; and a reflecting mirror film formed so as to be laid over a side surface of each of the plurality of projections.

15 Claims, 19 Drawing Sheets

U.S. PATENT DOCUMENTS

| | | |
|---|---|---|
| 2006/0104061 A1* | 5/2006 | Lerner et al. ................... 362/249 |
| 2006/0250676 A1* | 11/2006 | Hagood, IV ................... 359/296 |
| 2007/0182297 A1* | 8/2007 | Drazic et al. ................... 313/110 |
| 2008/0219005 A1* | 9/2008 | Fukuda et al. ................. 362/284 |
| 2008/0224963 A1* | 9/2008 | Takagi et al. ................... 345/76 |
| 2008/0253132 A1* | 10/2008 | Urabe et al. ................... 362/327 |
| 2009/0050905 A1* | 2/2009 | Abu-Ageel ...................... 257/80 |
| 2009/0079336 A1* | 3/2009 | Yamada et al. ................ 313/504 |
| 2010/0090595 A1* | 4/2010 | Nomura et al. ............... 313/506 |

* cited by examiner

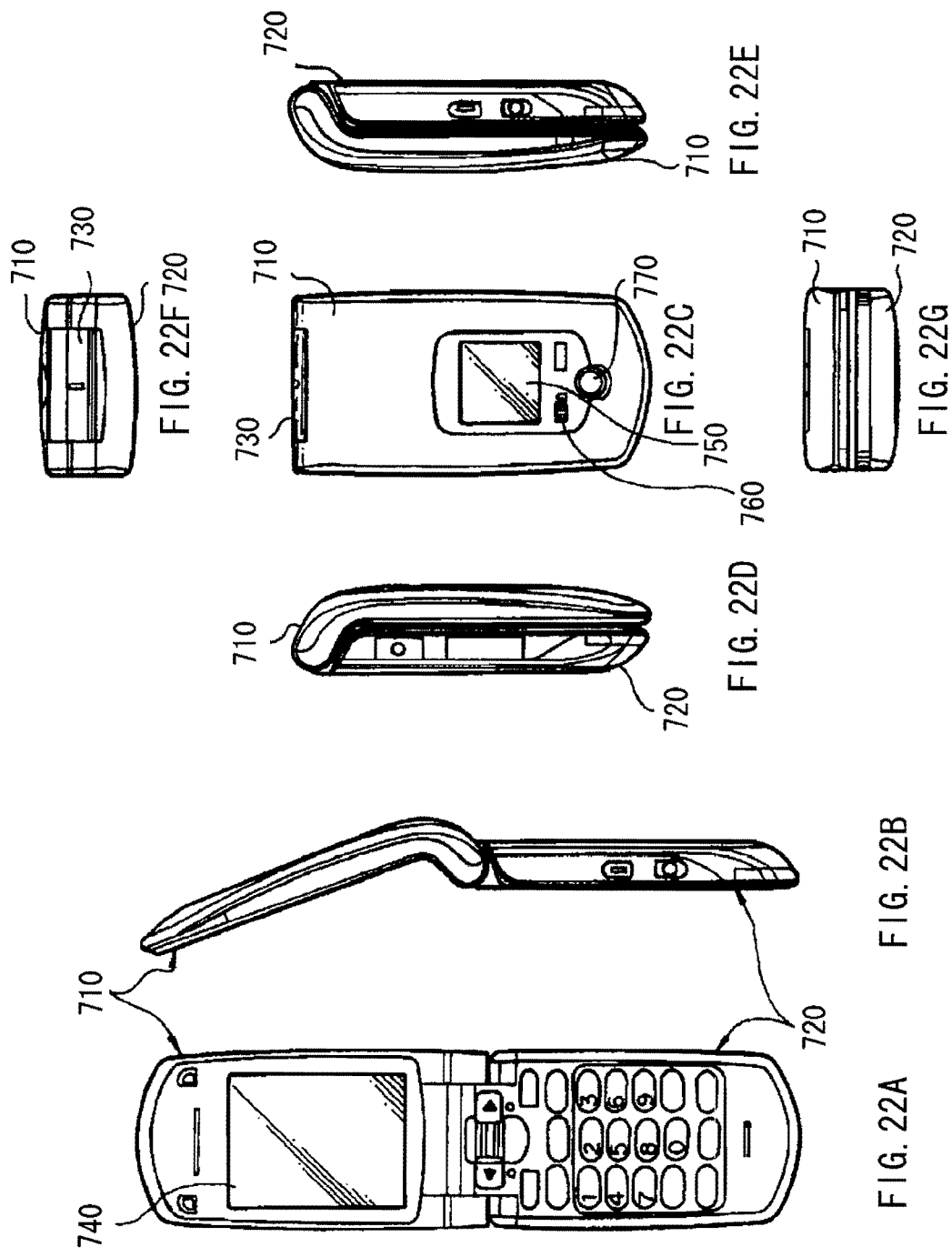

COLOR FILTER, METHOD OF MANUFACTURING THE SAME, AND LIGHT-EMITTING DEVICE

CROSS REFERENCES TO RELATED APPLICATIONS

The present application claims priority to Japanese Priority Patent Application JP2008-310510 filed in the Japan Patent Office on Dec. 5, 2008, the entire content of which is hereby incorporated by references.

BACKGROUND

The present application relates to a color filter used in, for example, a self-luminous element such as an organic EL (Electroluminescence) element, a method of manufacturing the color filter, and a light-emitting device using the color filter.

A self-luminous element such as an organic EL element includes a first electrode, an organic layer including a light-emitting layer and a second electrode in order on a substrate, and when a DC voltage is applied between the first electrode and the second electrode, electron-hole recombination occurs in the light-emitting layer to emit light. The emitted light may be extracted from a side closer to the second electrode, that is, from a side opposite to a side where a circuit including a TFT (Thin Film Transistor) or wiring is arranged so as to increase an aperture ratio. In the case where light is extracted from the side closer to the second electrode, a high-reflective metal electrode is typically used as the first electrode.

In a light-emitting device in which a plurality of such organic EL elements are formed, a refractive index in the elements is high (for example, a refractive index of 1.5 or over), so total reflection of light easily occurs at an interface with an air layer (with a refractive index of 1.0). Therefore, it is difficult to sufficiently extract emitted light to outside. Therefore, a technique of arranging a reflection plate (a reflector) on an light extraction side of the organic EL element so as to correct the emission angle of emitted light, thereby resulting in an improvement in light extraction efficiency has been proposed as described in Japanese Patent No. 3573393 and Published Japanese Translation No. 2005-531102 of PCT international application. In such a reflector, a plurality of projections are formed on a glass substrate so as to correspond to organic EL elements arranged, and a side surface of each projection is covered with a reflecting mirror film.

On the other hand, even in the case where the above-described plurality of organic EL elements emit, for example, three primary colors, that is, red (R), green (G) and blue (B) of light, it is effective to arrange color filters for these colors for the organic EL elements, respectively, so as to improve color purity or light-field contrast. In this case, the color filters for these colors are formed on one surface of a sealing substrate for sealing the organic EL elements so as to correspond to the organic EL elements, respectively. Then, the above-described reflector is bonded to surfaces of the color filters with an adhesive layer in between. In such a configuration, the emission angles of colors of light emitted from the organic EL elements are corrected in the projections in the reflector, and then the colors of light pass through corresponding color filters, respectively, to be extracted as the three primary colors of light.

As described above, the adhesive layer or the glass substrate is included between the color filters and the projections in the reflector. The adhesive layer or the glass substrate has a thickness of 10 μm or over, so a part of light emitted from the light-emitting layer may pass through the projections, and then may enter into color filters not corresponding to the color of the light in the adhesive layer or the glass substrate with the above-described thickness. Thereby, cross-talk between colors occurs.

SUMMARY

It is desirable to provide a color filter preventing the occurrence of cross-talk between colors while improving light extraction efficiency, a method of manufacturing the color filter, and a light-emitting device.

According to an embodiment, there is provided a color filter including: a plurality of color filter layers for a plurality of colors arranged on a substrate, a plurality of projections arranged in contact with the color filter layers, the projections of which parts on a side closer to the color filter layers are connected to one another; and a reflecting mirror film formed so as to be laid over a side surface of each of the plurality of projections.

According to an embodiment, there is provided a light-emitting device including: a drive panel including a plurality of self-luminous elements and a drive element driving the plurality of self-luminous elements; and a sealing panel arranged so as to face the drive panel. In this case, the sealing panel includes the above-described color filter according to the above-described embodiment on a substrate.

In the color filter and the light-emitting device according to the embodiment, light entering into the projections travels in straight lines in the projections or is reflected by the reflecting mirror film to pass through the projections, and then enters into corresponding color filter layers. At this time, the plurality of projections of which parts on a side closer to the color filter layers are connected to one another are arranged in contact with the plurality of color filter layers, respectively, so compared to the case where an adhesive layer or another substrate is arranged between the color filter layers and the projections, a distance between the color filter layers and the projections is reduced, thereby light emitted from the projections easily enters into corresponding color filter layers.

According to an embodiment, there is provided a method of manufacturing a color filter including steps of: forming a plurality of projections on surfaces of a plurality of color filter layers for a plurality of colors formed on a substrate so that parts on a side closer to the color filter layers of the plurality of projections are connected to one another; and forming a reflecting mirror film on a side surface of each of the plurality of projections. Thereby, the plurality of projections are collectively formed without arranging an adhesive layer or another substrate between the color filter layers and the projections. The reflecting mirror film is formed on the side surface of each of the projections.

In the color filter, the method of manufacturing a color filter and the light-emitting device according to the embodiment, the plurality of projections of which parts on a side closer to the color filter layers are connected to one another are arranged in contact with the plurality of color filter layers, respectively, so compared to the case where another substrate or an adhesive layer is arranged between the color filter layers and the projections, light leakage to color filters not corresponding to the color of light is allowed to be reduced. Therefore, while improving light extraction efficiency, the occurrence of cross-talk between colors is preventable. Thereby, in the light-emitting device, an improvement in color purity is allowed.

Additional features and advantages are described herein, and will be apparent from the following Detailed Description and the figures.

BRIEF DESCRIPTION OF THE FIGURES

FIGS. 22A to 22G illustrate Application Example 5, FIGS. 22A and 22B are a front view and a side view in a state in which Application Example 5 is opened, respectively, and FIGS. 22C, 22D, 22E, 22F and 22G are a front view, a left side view, a right side view, a top view and a bottom view in a state in which Application Example 5 is closed, respectively.

DETAILED DESCRIPTION

The present application will be described in detail below referring to the accompanying drawings according to an embodiment.

Figure 1:
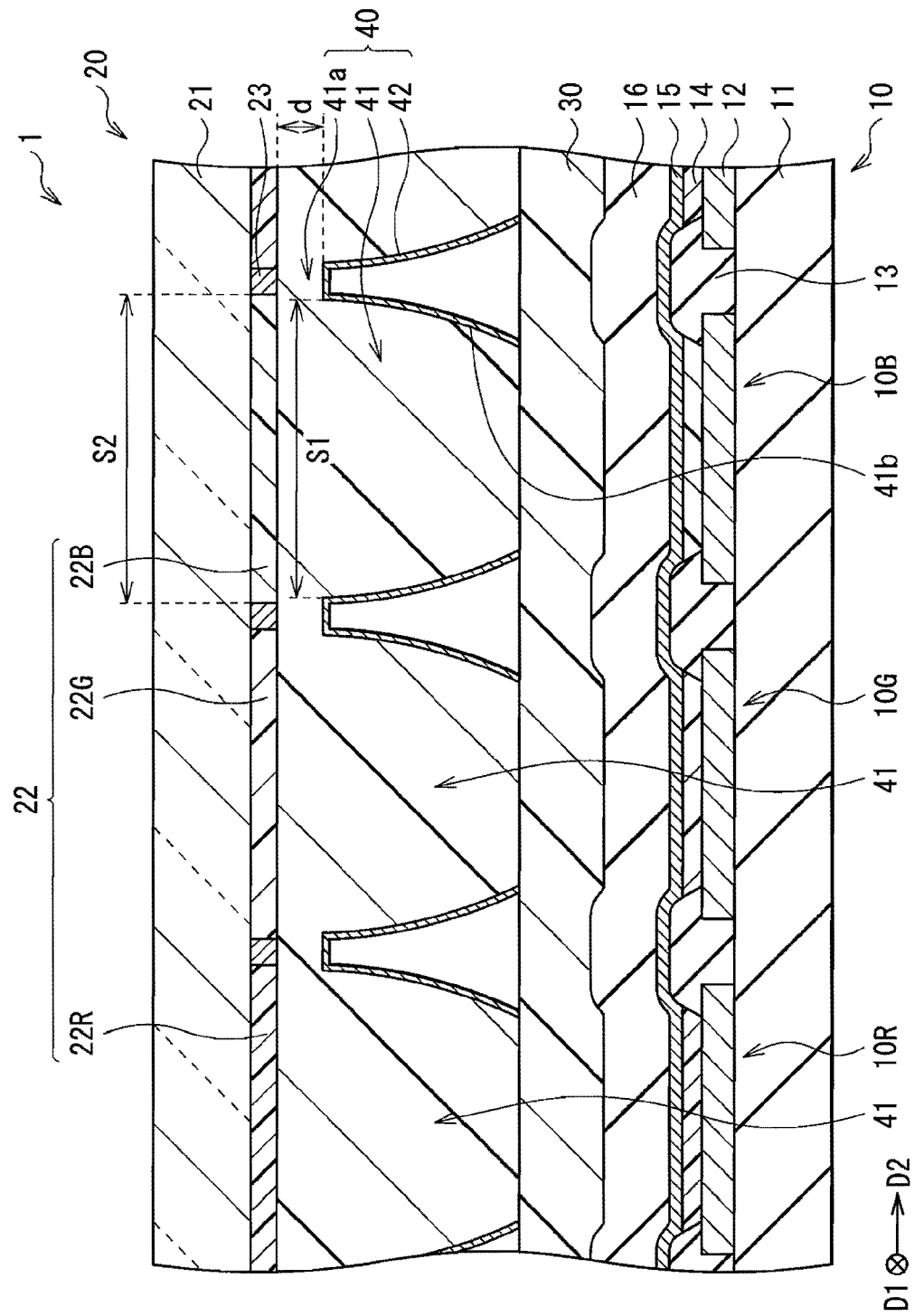
FIG. 1 is a schematic sectional view of a light-emitting device according to an embodiment.

FIG. 1 illustrates a sectional configuration of a light-emitting device 1 according to an embodiment. The light-emitting device 1 is used as a flat-type organic light-emitting color display or the like. In the light-emitting device 1, a drive panel 10 and a sealing panel 20 are bonded together with an adhesive layer 40 made of a thermosetting resin, an ultraviolet curable resin or the like in between. In the sealing panel 20 in the embodiment, a reflector 40 is integrally formed on a color filter layer 22, and the color filter layer 22 and the reflector 40 correspond to a color filter. The configuration of each component will be described below.

In the drive panel 10, organic EL elements 10R emitting red light, organic EL elements 10G emitting green light and organic EL elements 10B emitting blue light are formed in order in a matrix form on a drive substrate 11. The drive substrate 11 includes, for example, a TFT (Thin Film Transistor) or the like.

Figure 2:
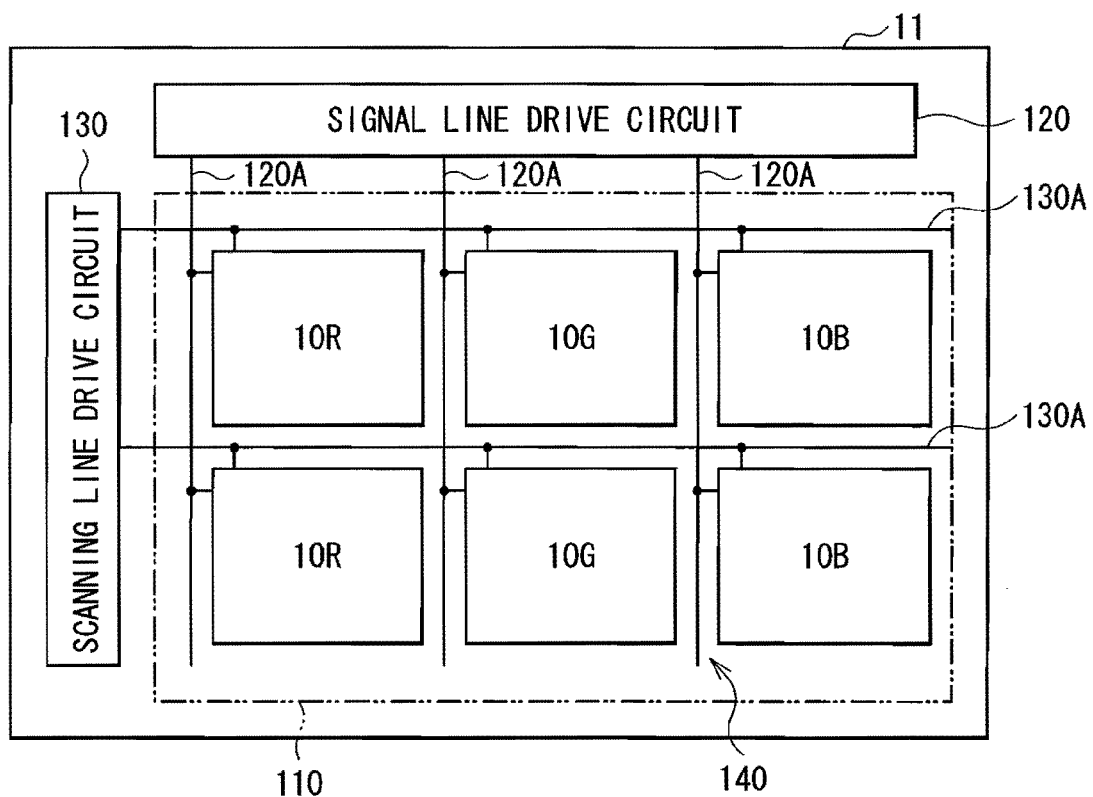
FIG. 2 is an illustration of a circuit configuration of a drive substrate illustrated in FIG. 1.
Figure 3:
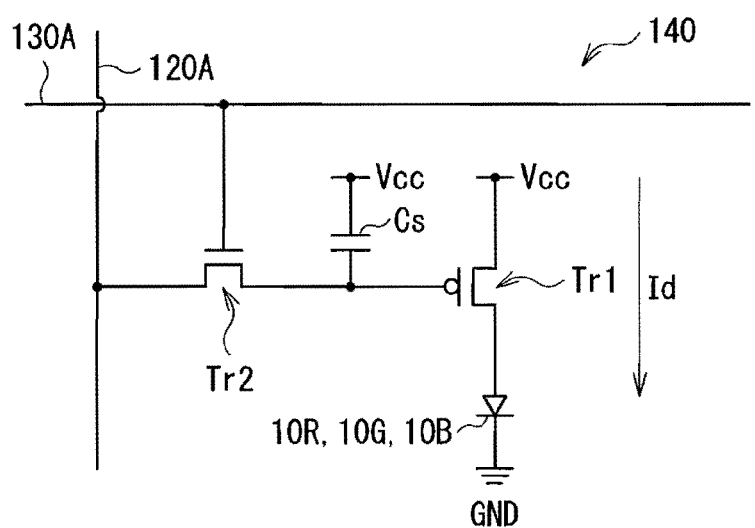
FIG. 3 is an equivalent circuit diagram illustrating an example of a pixel drive circuit illustrated in FIG. 1.

FIG. 2 illustrates an example of a circuit configuration in the drive substrate 11. Moreover, FIG. 3 illustrates an example of a pixel drive circuit 140. As illustrated in the drawings, in the drive substrate 11, a signal line drive circuit 120 and a scanning line drive circuit 130 as drivers for picture display are arranged around a display region 110 including the above-described organic EL elements 10R, 10G and 10B, and in the display region 110, the pixel drive circuit 140 is formed. The pixel drive circuit 140 is formed below a first electrode 12 which will be described later, and the pixel drive circuit 140 is an active drive circuit including a driving transistor Tr1 and a writing transistor Tr2, a capacitor (retention capacitor) Cs between the driving transistor Tr1 and the writing transistor Tr2, the organic EL element 10R (or 10G or 10B) connected to the driving transistor Tr1 in series between a first power source line (Vcc) and a second power source line (GND). The driving transistor Tr1 and the writing transistor Tr2 each are configured of a typical thin film transistor (TFT), and the TFT may have, for example, an inverted stagger configuration (a so-called bottom gate type) or a stagger configuration (a top gate type), and the configuration of the TFT is not specifically limited.

In the pixel drive circuit 140, a plurality of signal lines 120A are arranged in a column direction, and a plurality of scanning lines 130A are arranged in a row direction. An intersection between each signal line 120A and each scanning line 130A corresponds to one (a subpixel) of the organic EL elements 10R, 10G and 10B. Each signal line 120A is connected to the signal line drive circuit 120, and an image signal is supplied from the signal line drive circuit 120 to a source electrode of the writing transistor Tr2 through the signal line 120A. Each scanning line 130A is connected to the scanning line drive circuit 130, and a scanning signal is sequentially supplied from the scanning line drive circuit 130 to a gate electrode of the writing transistor Tr2 through the scanning line 130A.

The organic EL elements 10R, 10G and 10B each have a configuration in which the first electrode 12 as an anode, an insulating film 13, an organic layer 14 including a light-emitting layer which will be described later, and the second electrode 15 as a cathode are laminated in this order on the drive substrate 11, and if necessary, the organic EL elements 10R, 10G and 10B are covered with a protective film 16. In addition, the drive substrate 11 includes the above-described pixel drive circuit 140 and a planarization layer (not illustrated), and the first electrode 12 is formed on the planarization layer. Moreover, an light emission surface of each of the organic EL elements 10R, 10G and 10B preferably has a larger area than a light incident surface (a surface on a side closer to the organic EL elements 10R, 10G and 10B) of each projection 41 (which will be described later) of the reflector 40. Alternatively, in the case where the light emission surface has an area equal to or smaller than the light incident surface of each projection 41, both of the light emission surface of each of the organic EL elements 10R, 10G and 10B and the light incident surface of each projection 41 preferably have the same shape (including a similar shape), so that uniform emission characteristics are easily achieved.

The first electrodes 12 are formed so as to correspond to the organic EL elements 10R, 10G and 10B, respectively, and are electrically separated from one another by the insulating film 13. Moreover, the first electrodes 12 have a function as a reflective electrode reflecting light emitted from the light-emitting layer, and it is desirable that the first electrodes 12 have as high reflectivity as possible so as to improve light emission efficiency. The first electrodes 12 each have, for example, a thickness of 100 nm to 1000 nm both inclusive, and are made of aluminum (Al) or an alloy including aluminum (Al), or silver (Ag) or an alloy including silver (Ag). Moreover, the first electrodes 12 may be made of a simple substance or an alloy of any other metal element such as chromium (Cr), titanium (Ti), iron (Fe), cobalt (Co), nickel (Ni), molybdenum (Mo), copper (Cu), tantalum (Ta), tungsten (W), platinum (Pt) or gold (Au).

The insulating film 13 is provided to secure insulation between the first electrode 12 and the second electrode 15 and to accurately have a desired shape of a light emission region, and is made of, for example, an organic material such as photosensitive acrylic, polyimide or polybenzoxazole or an inorganic insulating material such as silicon oxide ($SiO_2$). The insulating film 13 has openings corresponding to light emission regions of the first electrodes 12. The organic layer 14 and the second electrode 15 may be continuously arranged on not only the light emission regions but also on the insulating film 13, but light is emitted only from the openings of the insulating film 13.

The organic layer 14 has, for example, a configuration in which a hole injection layer, a hole transport layer, a light-emitting layer and an electron transport layer are laminated in order from a side closer to the first electrode 12, but any of these layers except for the light-emitting layer may be arranged if necessary. Moreover, the organic layer 14 may have a different configuration depending on colors of light emitted from the organic light-emitting devices 10R, 10G or 10B. The hole injection layer is provided to enhance hole injection efficiency, and is a buffer layer for preventing leakage. The hole transport layer is provided to enhance the hole transport efficiency to the light-emitting layer. The light-emitting layer emits light by the recombination of electrons and holes in response to the application of an electric field. The electron transport layer is provided to enhance electron transport efficiency to the light-emitting layer. In addition, an electron injection layer (not illustrated) made of LiF, $Li_2O$ or the like may be arranged between the electron transport layer and the second electrode 15.

In the organic EL element 10R, examples of the material of the hole injection layer include 4,4'4"-tris(3-methylphenylphenylamino)triphenylamine (m-MTDATA) and 4,4'4"-tris(2-naphthylphenylamino)triphenylamine (2-TNATA), and examples of the material of the hole transport layer include bis[(N-naphthyl)-N-phenyl]benzidine ($\alpha$-NPD). Moreover, in the organic EL element 10R, examples of the material of the light-emitting layer include an 8-quinolinol aluminum complex (Alq3) mixed with 40 vol % of 2,6-bis[4-[N-(4-methoxyphenyl)-N-phenyl]aminostyryl]naphthalene-1,5-dicarbonitrile (BSN-BCN), and examples of the material of the electron transport layer include Alq3.

In the organic EL element 10G, examples of the material of the hole injection layer include m-MTDATA and 2-TNATA, and examples of the material of the hole transport layer include $\alpha$-NPD. Moreover, in the organic EL element 10G, examples of the material of the light-emitting layer include Alq3 mixed with 3 vol % of Coumarin6, and examples of the material of the electron transport layer include Alq3.

In the organic EL element 10B, examples of the material of the hole injection layer include m-MTDATA and 2-TNATA, and examples of the material of the hole transport layer include $\alpha$-NPD. Moreover, in the organic EL element 10B, examples of the material of the light-emitting layer include spiro6$\Phi$, and examples of the material of the electron transport layer include Alq3.

The second electrode 15 has, for example, a thickness of 5 nm to 50 nm both inclusive, and is made of a simple substance or an alloy of a metal element such as aluminum (Al), magnesium (Mg), calcium (Ca) or sodium (Na). Among them, the second electrode 15 is preferably made of an alloy of magnesium and silver (a MgAg alloy) or an alloy of aluminum (Al) and lithium (Li) (an AlLi alloy). Moreover, the second electrode 15 may be made of ITO (indium-tin complex oxide) or IZO (indium-zinc complex oxide).

The protective film 16 has, for example, a thickness of 500 nm to 10000 nm both inclusive, and is made of silicon oxide ($SiO_2$), silicon nitride (SiN) or the like.

The sealing panel 20 includes an adhesive layer 30 as well as a sealing substrate 21 which seals the organic EL elements 10R, 10G and 10B. The sealing substrate 21 is made of a material such as glass which is transparent to light generated in the organic EL elements 10R, 10G and 10B. On the sealing substrate 21, for example, the color filter layer 22 and a light-shielding film 23 as a black matrix are arranged.

The color filter layer 22 improves color purity of colors of light generated in the organic EL element 10R, 10G and 10B so as to improve contrast. The color filter layer 22 includes a red color filter 22R, a green color filter 22G and a blue color filter 22B, which are arranged in order corresponding to the organic EL elements 10R, 10G and 10B, respectively.

These color filters 22R, 22G and 22B are formed so as to face the organic layers 14 on the drive substrate 11, and are made of a resin mixed with a pigment of a corresponding color. Thereby, the color filters 22R, 22G and 22B are adjusted so as to have high light transmittance in a red, green or blue wavelength region and low light transmittance in other wavelength regions.

The light-shielding film 23 absorbs light reflected by the organic EL elements 10R, 10G and 10B and wiring between them or stray light so as to improve contrast. The light-shielding film 23 is arranged along boundaries of the red filter 22R, the green filter 22G and the blue filter 22B. The light-shielding film 23 is made of, for example, one or more black resin films mixed with a black colorant, or one or more thin films made of metal such as chromium (Cr), a metal nitride or a metal oxide. The reflector 40 is arranged on the surfaces of such a color filter layer 22 and such a light-shielding film 23.

The reflector 40 corrects the emission angles of colors of light from the organic EL elements 10R, 10G and 10B so as to improve light extraction efficiency. The reflector 40 includes a plurality of projections 41 formed in contact with the color filter layer 22, and a reflecting mirror film 42 formed so as to be laid over a side surface 41*b* of each of the projections 41.

The plurality of projections 41 are arranged so as to be connected to one another with parts (connection sections 41*a*) of the projections 41 on a side closer to the color filter layer 22 in between. The projections 41 are arranged so as to correspond to the color filters 22R, 22G and 22B in the color filter layer 22, respectively. A plane area S1 on the side closer to the color filter layer 22 of each projection 41 is equal to or smaller than an opening area S2 of each of the color filters 22R, 22G and 22B (S1≦S2). Such projections 41 are made of, for example, an ultraviolet curable or thermosetting resin material, more specifically, Threebond3021J (a product name) manufactured from Threebond Co., Ltd. or the like, and the pitch (width) of each projection 41 is, for example, 20 μm to 100 μm, and the thickness of each projection 41 is, for example, 0.5 to 1.0 times as large as the pitch. The thickness d of the connection section 41a is approximately 15% or less of a pixel pitch, and is preferably as small as possible so as to reduce light leakage to adjacent elements.

Figure 4:
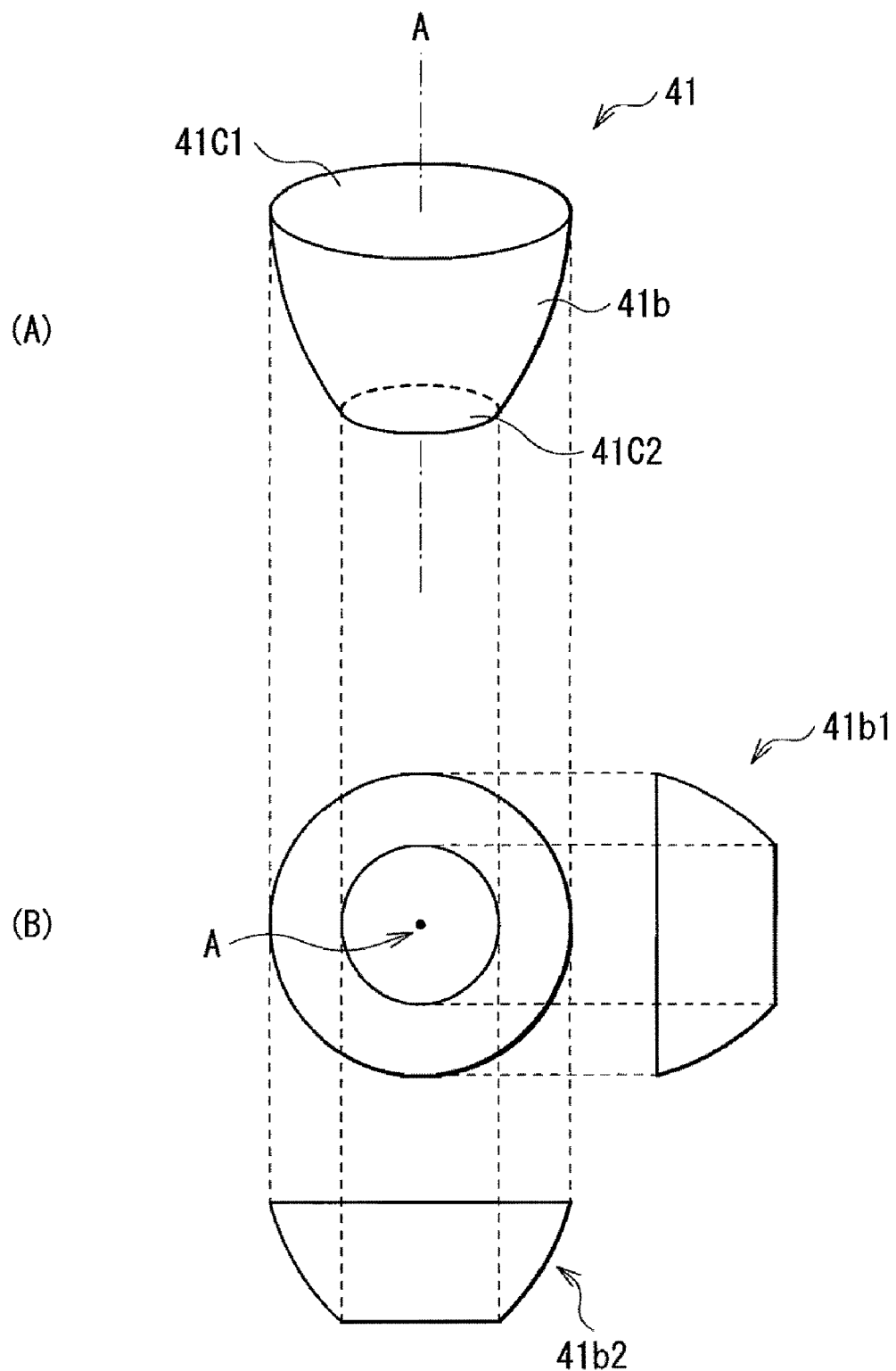
FIG. 4 is an illustration for describing the shape of a projection illustrated in FIG. 1.

Referring to FIG. 4, a specific shape of each projection 41 will be described below. FIG. 4(A) illustrates the projection 41 viewed from obliquely above, and FIG. 4(B) illustrates a top view and a side view. However, the side view is viewed from directions along two directions D1 and D2 orthogonal to each other in a substrate surface. Each projection 41 has, for example, a rotationally symmetrical shape with respect to an axis A, and has the side surface 41b, a lower base surface (a surface on the side closer to the color filter layer 22, the same shall apply hereinafter) 41c1 and an upper base surface (a surface on a side closer to the organic layer 14, the same shall apply hereinafter) 41c2. The lower base surface 41c1 and the upper base surface 41c2 are flat surfaces parallel to each other, and the lower base surface 41c1 and the upper base surface 41c2 each have a circular planar shape.

The side surface 41b is, for example, a paraboloidal surface, and at least side surface shapes b1 and b2 viewed from the directions D1 and D2 are equal to each other. However, in the embodiment, the side surface shapes 41b1, 41b2, ... viewed from all directions are equal to one another. In other words, the taper shapes in all directions of the side surface 41b are equal to one another.

The reflecting mirror film 42 reflects light entering from the upper base surface 41c2 of the projection 41 to correct and emit the light in such an angle direction that total reflection does not occur at an interface with an external air layer. The reflecting mirror film 42 has a thickness of, for example, approximately 50 nm to 200 nm, and is made of a simple substance of aluminum (Al) or silver (Ag) or an alloy including these metals.

The emission characteristics (luminous intensity distribution characteristics) by the reflecting mirror film 42 are appropriately adjustable by changing the pitch or thickness of the above-described projection 41 or the taper shape of the side surface 41b according to the application of the light-emitting device 1. For example, in the case where the light-emitting device 1 is applied to a television, the emission characteristics are set so as to have a wide viewing angle, and in the case where the light-emitting device 1 is applied to a cellular phone, the emission characteristics are set so as to have high luminance in a front direction.

The above-described light-emitting device 1 is manufactured by the following steps.

First, the organic EL elements 10R, 10G and 10B are formed on the drive substrate 11 to form the drive panel 10. More specifically, first, the pixel drive circuit 140 and the planarization layer (not illustrated) are formed on the drive substrate 11 made of the above-described material, and then the first electrodes 12 made of the above-described material are formed by, for example, a sputtering method, and the first electrodes 12 are patterned into a predetermined shape by photolithography and etching. Next, the whole surface of the drive substrate 11 is coated with a photosensitive resin, and openings are formed in the photosensitive resin by exposure to light and development, and then the photosensitive resin is fired to form the insulating film 13. Next, for example, the organic layer 14 and the second electrode 15 which are made of the above-described materials are formed by, for example, an evaporation method to form the organic EL elements 10R, 10G and 10B, and then the organic EL elements 10R, 10G and 10B are coated with the protective film 16 made of the above-described material. Thereby, the drive panel 10 is formed.

On the other hand, the light-shielding film 23 made of the above-described material is formed on the sealing substrate 21, and then the light-shielding film 23 is patterned into a predetermined shape. Next, the sealing substrate 21 is coated with the materials of the color filters 22R, 22G and 22B by spin-coating or the like, and the materials of the color filters 22R, 22G and 22B are patterned and fired by a photolithography technique to form the color filters 22R, 22G and 22B. Thereby, the color filter layer 22 and the light-shielding film 23 are formed on the sealing substrate 21.

Figure 5A:
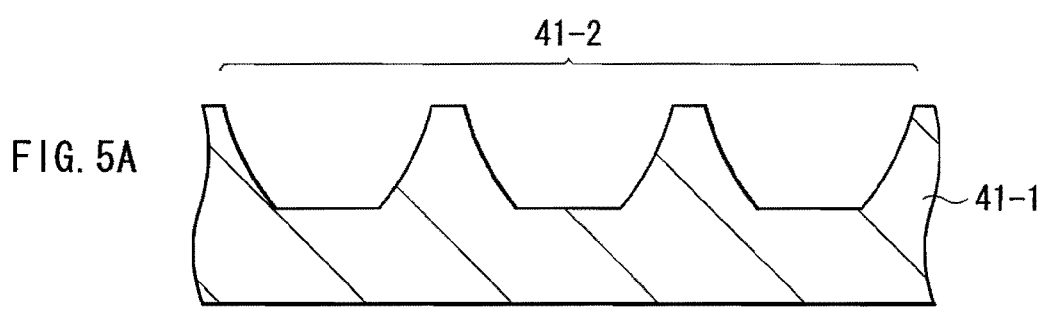
FIGS. 5A and 5B are sectional views illustrating a method of manufacturing the light-emitting device illustrated in FIG. 1 in order of steps.
Figure 5B:
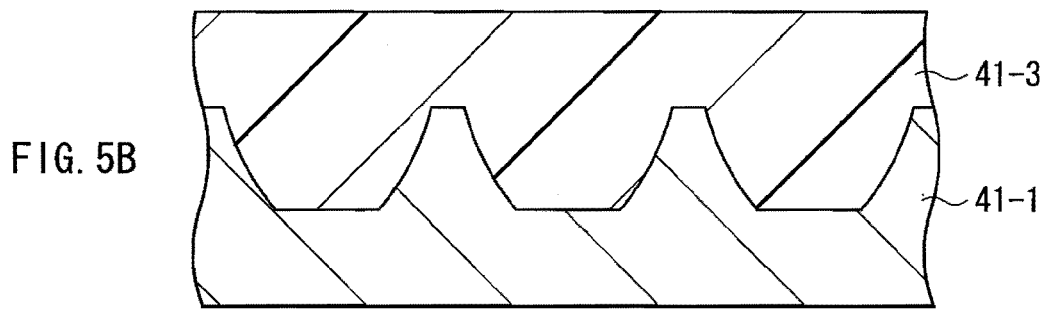

Next, the reflector 40 is formed on the formed color filter layer 22 and the formed light-shielding film 23. At this time, first, as illustrated in FIG. 5A, for example, a reverse pattern 41-2 of the plurality of projections 41 is formed on a surface of a master (a stamper) 41-1 made of, for example, polycarbonate (PC) or the like by, for example, a mask imaging method using a KrF excimer laser. Thereby, the stamper 41-1 for pattern transfer is formed. Next, as illustrated in FIG. 5B, a surface (a surface where the reverse pattern 41-2 is formed) of the stamper 41-1 is thoroughly coated with, for example, an acrylic UV curable resin to form a resin layer 41-3.

Figure 6A:
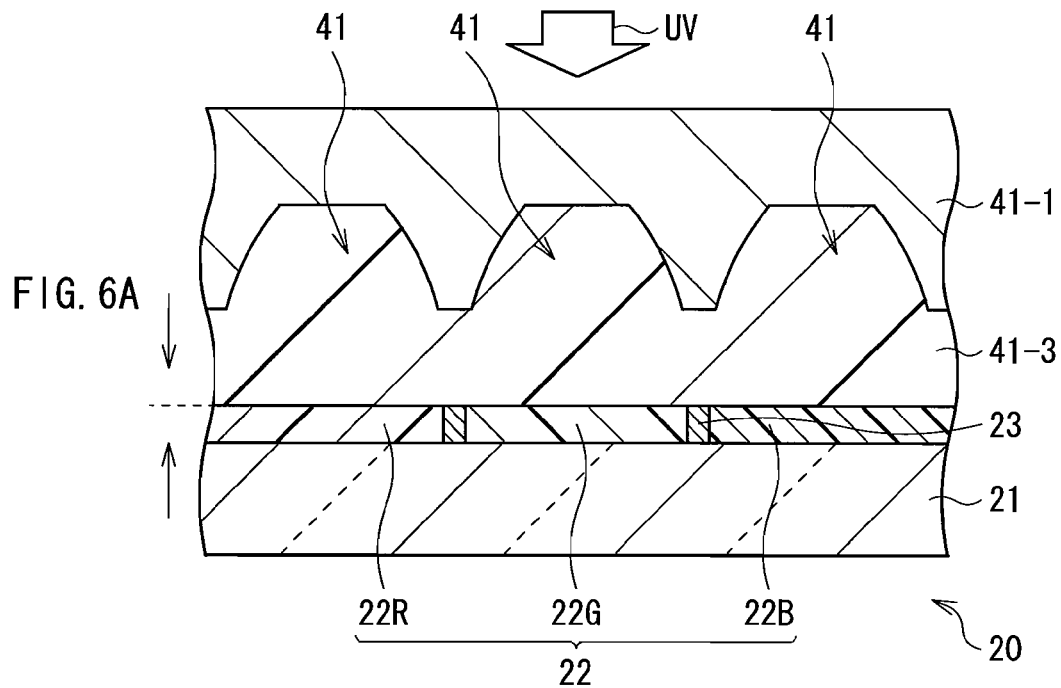
FIGS. 6A and 6B are sectional views illustrating steps following FIGS. 5A and 5B.

Next, as illustrated in FIG. 6A, the stamper 41-1 on which the resin layer 41-3 is formed is pressed to the color filter layer 22 so that the color filter layer 22 and the resin layer 41-3 face each other. At this time, alignment is performed so that the projections 41 of the resin layer 41-3 face the color filters 22R, 22G and 22B, respectively. Next, an ultraviolet ray UV is applied to the whole surface from, for example, the stamper 41-1 side to cure the resin layer 41-3.

Figure 6B:
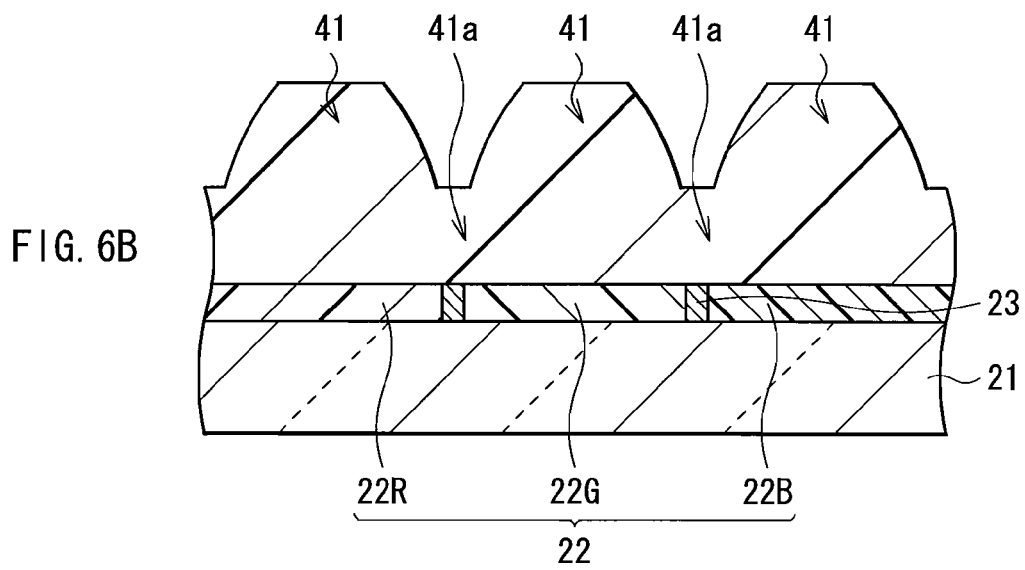

Next, as illustrated in FIG. 6B, the stamper 41-1 is removed. Thereby, the plurality of projections 41 are collectively transferred on a surface of the color filter layer 22. At this time, apart from the shape formed by the stamper 41-1, a layer of a resin material is formed between the color filter layer 22 and the shapes of the projections 41. The layer of the resin material is a remaining resin material which is not molded by the stamper 41-1, and the adhesion of the projections 41 to the color filter layer 22 is improved by the layer of the resin material. In other words, parts of the plurality of projections 41 on the side closer to the color filter layer 22 are connected to one another.

Figure 7A:
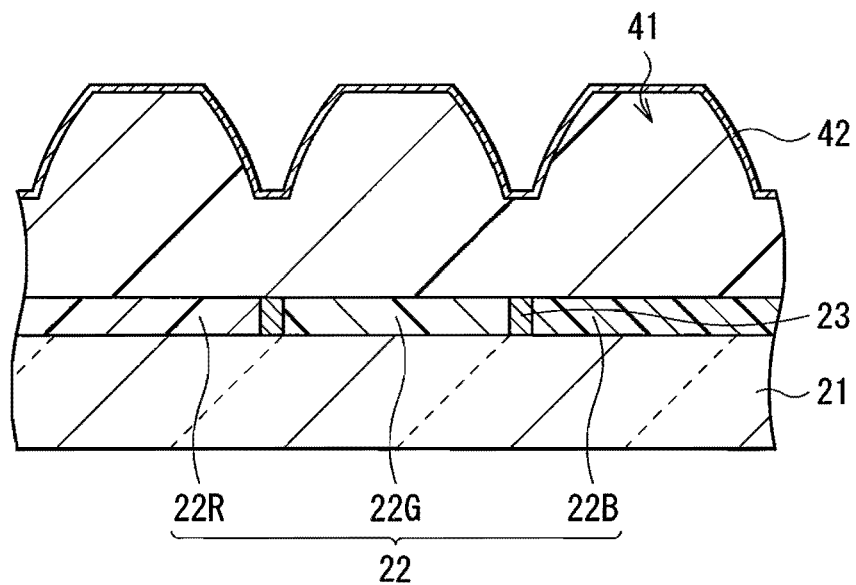
FIGS. 7A and 7B are sectional views illustrating steps following FIGS. 6A and 6B.

Then, as illustrated in FIG. 7A, the reflecting mirror film 42 made of the above-described material is formed by, for example, a vacuum deposition method, a sputtering method or a coating method so as to be laid over the surfaces of the formed projections 41.

Figure 7B:
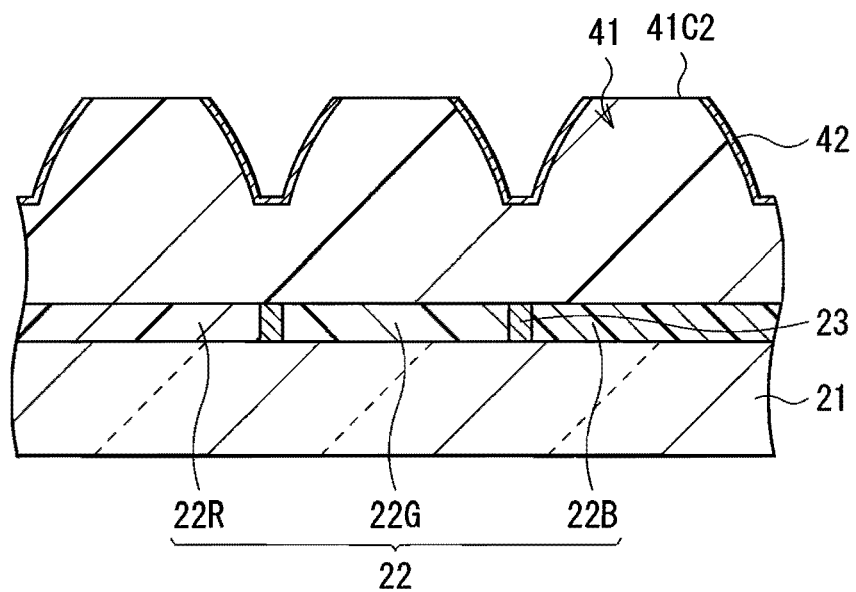

Next, as illustrated in FIG. 7B, a part laid over the upper base surface 41c2 of each projection 41 of the reflecting mirror film 42 is removed by, for example, wet etching or the like. Thereby, openings are formed on the upper base surfaces 41c2 of the projections 41. Alternatively, such openings may be formed by the following steps. For example, when the above-described reflecting mirror film 42 is formed, regions facing the upper base surfaces 41c2 of the projections 41 may be masked in advance so as to prevent the reflecting mirror film 42 from being formed on the upper base surfaces 41c2. Thereby, the sealing panel in which the reflector 40 is formed on the color filter layer 22 is formed.

Finally, the drive panel 10 and the sealing panel 20 are aligned so that the organic EL elements 10R, 10G and 10B face projections 41 in the reflector 40, respectively, and then the drive panel 10 and the sealing panel 20 are bonded together with the adhesive layer 30 in between. Thus, the light-emitting device 1 illustrated in FIG. 1 is completed.

Figure 8:
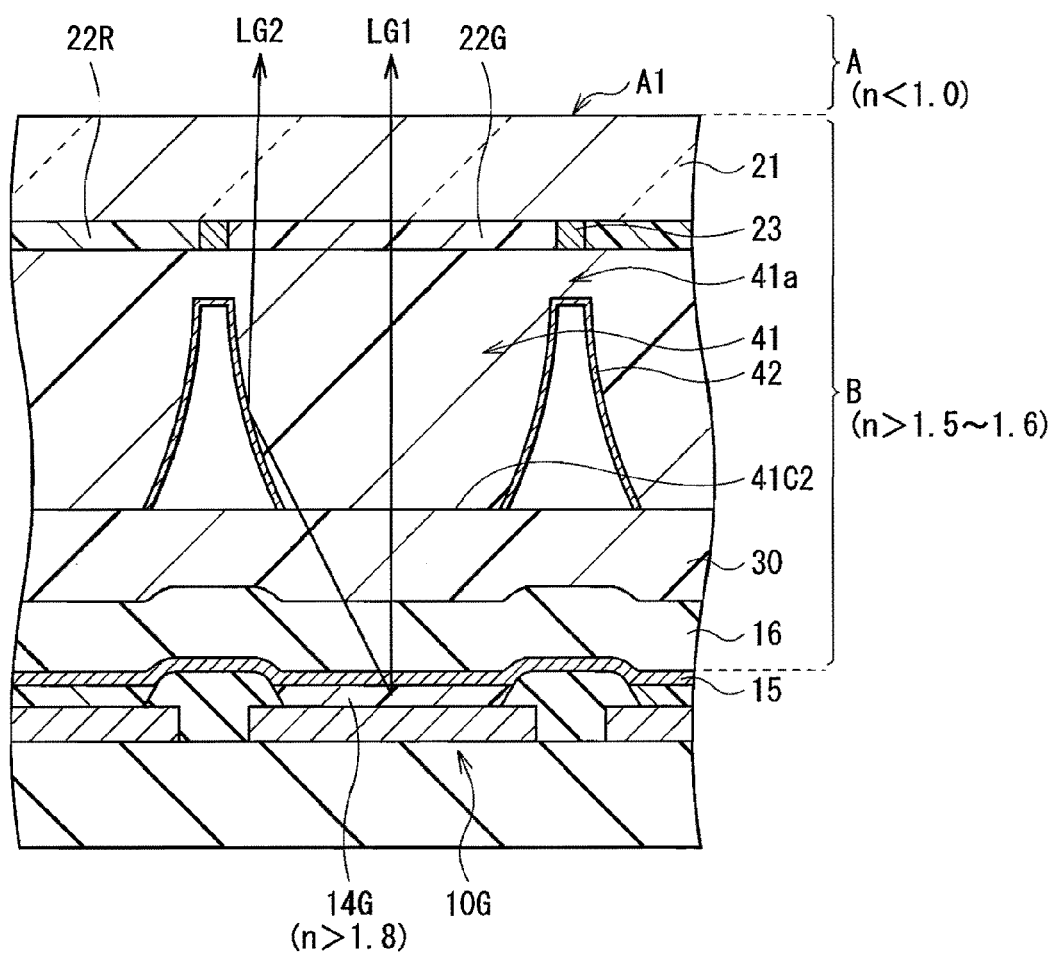
FIG. 8 is a schematic view illustrating an optical path of light emitted from an organic layer.
Figure 9:
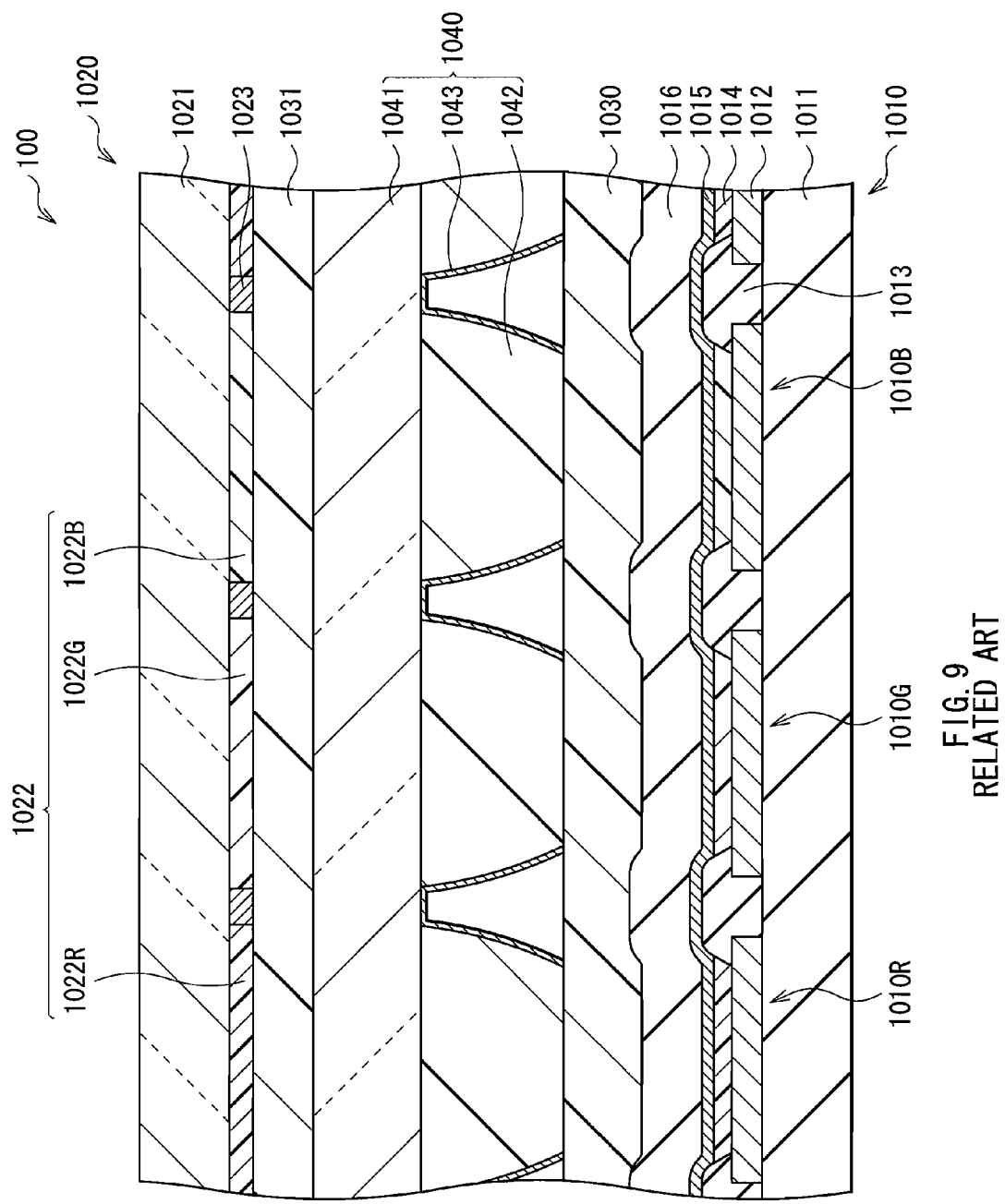
FIG. 9 is a schematic sectional view of a light-emitting device according to a comparative example.

Next, functions and effects of the above-described light-emitting device 1 will be described referring to FIGS. 1 to 9. FIG. 8 schematically illustrates an optical path of light emitted from a green organic layer 14G. FIG. 9 is a schematic sectional view of a light-emitting device according to a comparative example.

In the light-emitting device 1, when a drive current is injected into each of the organic EL elements 10R, 10G and 10B in response to a scanning signal supplied from the scanning line drive circuit 130 and an image signal supplied from the signal line drive circuit 120, holes and electrons are recombined in the organic layer 14 of each of the organic EL elements 10R, 10G and 10B to emit light. The light is emitted to above the second electrode 15, and passes through the adhesive layer 30, the reflector 40, the color filter layer 22 in order to be extracted from the top of the sealing panel 20 as red light, green light and blue light.

Referring to FIG. 8, light extraction in the light-emitting device 1 will be described below. However, for the purpose of facilitation, description will be given referring to the organic EL element 10G of three organic EL elements 10R, 10G and 10B. As illustrated in FIG. 8, a part (LG1) of green light emitted from a green organic layer 14G enters from the upper base surface 41c2 of the projection 41 in the reflector 40, and then travels in a straight line in the projection 41, and passes through the color filter 22G corresponding to the green light, thereby the part LG1 is extracted from the top of the sealing substrate 21 as green light. On the other hand, the optical path of light with a large emission angle of the green light emitted from the green organic layer 14G, that is, the optical path of light LG2 entering into the projection 41 at an angle equal to or larger than a predetermined angle of the green light is changed by the reflecting mirror film 42 so that the incident angle of the light LG2 to an interface A1 is equal to or smaller than a critical angle, and then the light LG2 enters into the color filter 22G. Thereby, light extraction efficiency is improved.

Next, referring to FIG. 9, a light-emitting device 100 according to the comparative example will be described below. The light-emitting device 100 is configured by bonding a drive panel 1010 in which organic light-emitting devices 1010R, 1010G and 1010B are formed on a drive substrate 1011 and a sealing panel 1020 in which a color filter layer 1022 is formed on a sealing substrate 1021 with an adhesive layer 1030 in between. A reflector 1040 is arranged on a side closer to the color filter layer 1022 of the sealing panel 1020.

The organic EL elements 1010R, 1010G and 1010B each have a configuration in which a first electrode 1012, an organic layer 1014 and a second electrode 1015 are laminated in order from the drive substrate 1011, and are covered with a protective layer 1016. The first electrode 1012 is patterned for each of the organic EL elements 1010R, 1010G and 1010B, and the first electrodes 1012 of the organic EL elements 1010R, 1010G and 1010B are electrically separated from one another by an insulating film 1013. In such a configuration, light is extracted from the second electrode 1015. In the sealing panel 1020, a light-shielding film 1023 as a so-called black matrix and the color filter layer 1022 (including a red filter 1022R, a green filter 1022G and a blue filter 1022B) are formed.

The reflector 1040 is formed by forming a plurality of projections 1042 on a substrate 1041 made of glass or the like, and then forming a reflecting mirror film 1043 on a side surface of each of the projections 1042. The projections 1042 are arranged so as to face the above-described organic EL elements 1010R, 1010G and 1010B, respectively.

In the light-emitting device 100, such a reflector 1040 is bonded to the above-described sealing panel 1020 with an adhesive layer 1031 in between so that the glass substrate 1041 and the color filter layer 1022 face each other. In such a configuration, the glass substrate 1041 and the adhesive layer 1031 are arranged between the color filter layer 1022 and the projections 1042. However, the adhesive layer 1031 or the glass substrate 1041 has a thickness of 10 μm or over, so a part of emitted light may enter into color filters not corresponding to the color of the emitted light in the adhesive layer 1031 or the glass substrate 1041 with the above-described thickness. Thereby, cross-talk between colors occurs. Moreover, a distance between the color filter layer 1022 and each of the organic EL elements 1010R, 1010G and 1010B is increased by the thickness of the glass substrate 1041 or the adhesive layer 1031, and viewing angle characteristics are deteriorated, because when the distance between the color filter layer 1022 and each of the organic EL elements 1010R, 1010G and 1010B is increased, light emitted obliquely from the reflector 1040 enters and is absorbed into the light-shielding film 1023, thereby specifically luminance in an oblique direction is reduced.

On the other hand, in the embodiment, the plurality of projections 41 of which parts on the side closer to the color filter layer 22 are connected to one another are arranged in contact with the color filter layer 22, so the above-described glass substrate or the adhesive layer with a large thickness is not arranged between the color filter layer 22 and the projections 41. Therefore, colors of light emitted from the projections 41 of the reflector 40 enter into corresponding color filters 22G, 22R and 22B in the color filter layer 22, respectively, without passing through other layers. Therefore, each color of light emitted from each of the organic EL elements 10R, 10G and 10B is prevented from entering into color filters not corresponding to the color of light. Moreover, as the glass substrate and the adhesive layer are not arranged, a distance between the color filter layer 22 and each of the organic EL elements 10R, 10G and 10B is short, so the above-described light entering into the light-shielding film 23 is less likely to be generated. Therefore, good viewing angle characteristics are achieved.

As described above, in the embodiment, the plurality of projections 41 of which parts on the side closer to the color filter layer 22 are connected to one another are arranged in contact with the color filter layer 22, so the thickness between the color filter layer 22 and the projections 41 is reduced, thereby each color of light emitted from each of the organic EL elements 10R, 10G and 10B is prevented from entering into color filters not corresponding to the color of light. Therefore, while improving the light extraction efficiency, the occurrence of cross-talk between colors is preventable.

Moreover, when the side surface 41b of each of the projections 41 is a paraboloidal surface, and the side surface shapes 41b1, 41b2, ... in all directions are equal to one another, light entering into the projections 41 is allowed to be uniformly emitted in all directions. Thereby, uniform emission characteristics in all directions are obtainable.

Further, when the plane area S1 on the side closer to the color filter layer 22 of each projection 41 is equal to or smaller than the opening area S2 of each of the color filters 22R, 22G and 22B (S1≦S2), colors of light emitted from the projections 41 easily enter into corresponding color filters 22R, 22G and 22B, respectively. Therefore, the occurrence of cross-talk between colors is preventable more effectively.

Figure 10:
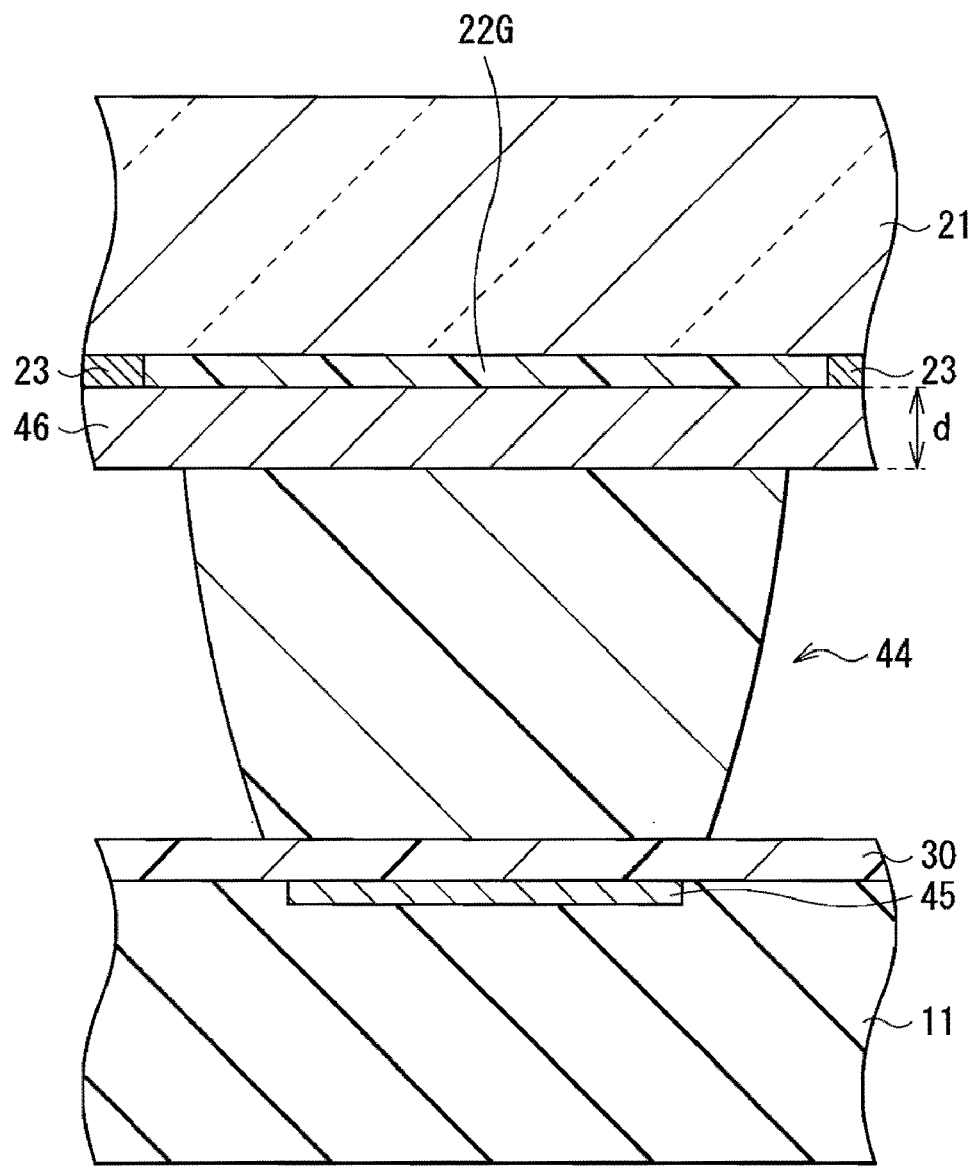
FIG. 10 is an illustration for describing an evaluation system according to simulations 1 and 2.

Moreover, as an implementation example of the embodiment, simulations 1 and 2 evaluating the emission characteristics (luminous intensity distribution characteristics) were performed using an evaluation system illustrated in FIG. 10. More specifically, in the simulations 1 and 2, a configuration in which in the case where the reflector 44 was included between the drive substrate 11 and the sealing substrate 21 including the color filter 22G formed therein, an intermediate layer 46 with a thickness d1 was included between the color filter 22G and the reflector 44 was assumed. In the simulations 1 and 2, the following light sources (1) and the following reflectors (2) were used.

Simulation 1
1. Light source: Lambert
2. Reflector: Liner Reflector

Figure 11:
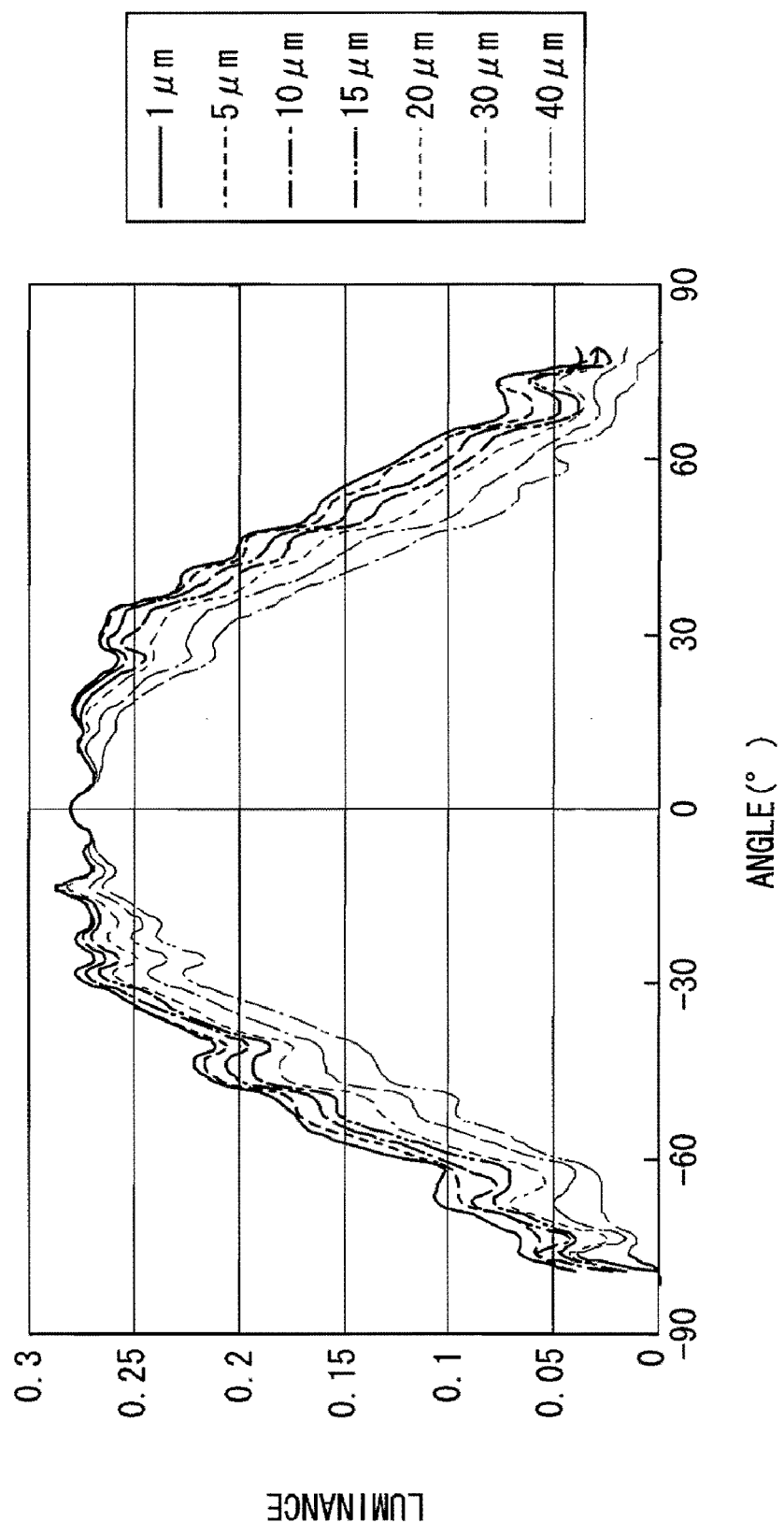
FIG. 11 is a plot illustrating a luminance distribution with respect to a viewing angle in the simulation 1.
Figure 12:
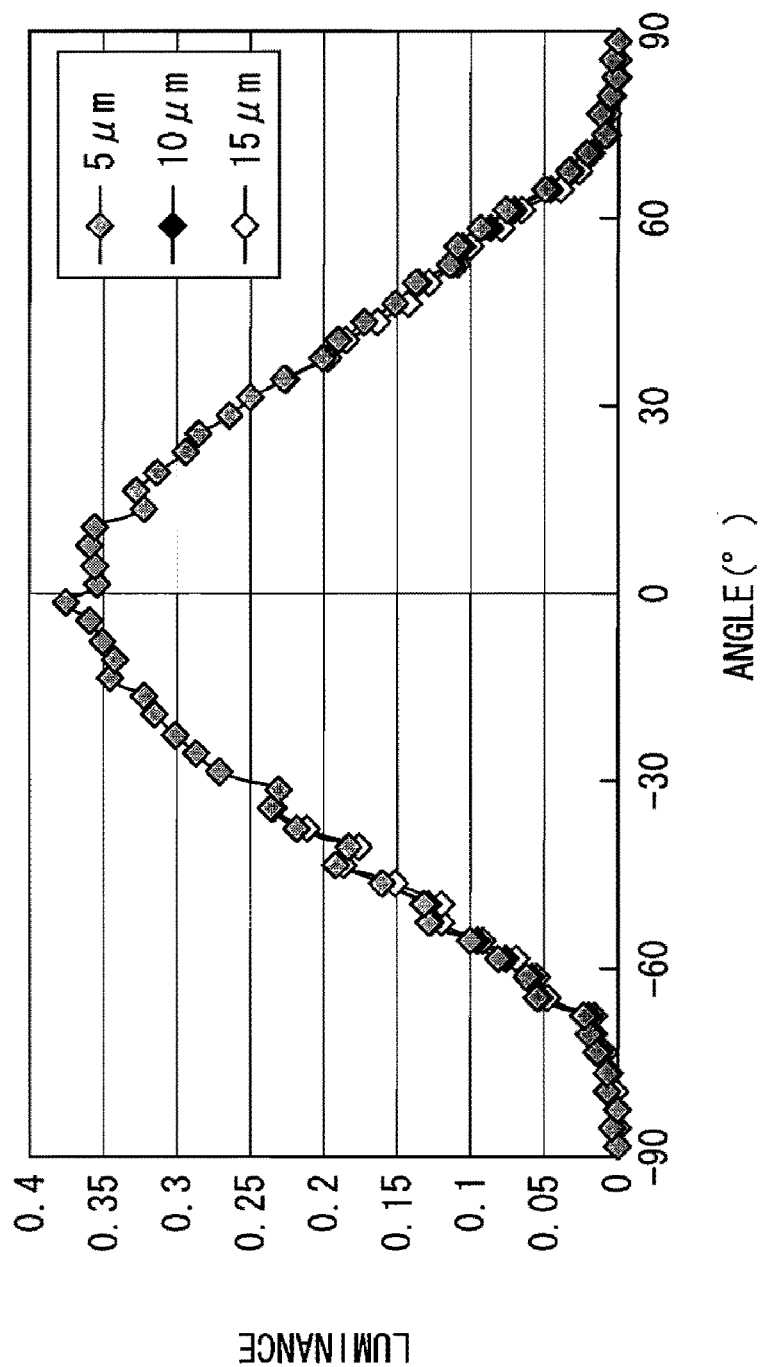
FIG. 12 is a plot illustrating a luminance distribution with respect to a viewing angle in the simulation 2.
Figure 13:
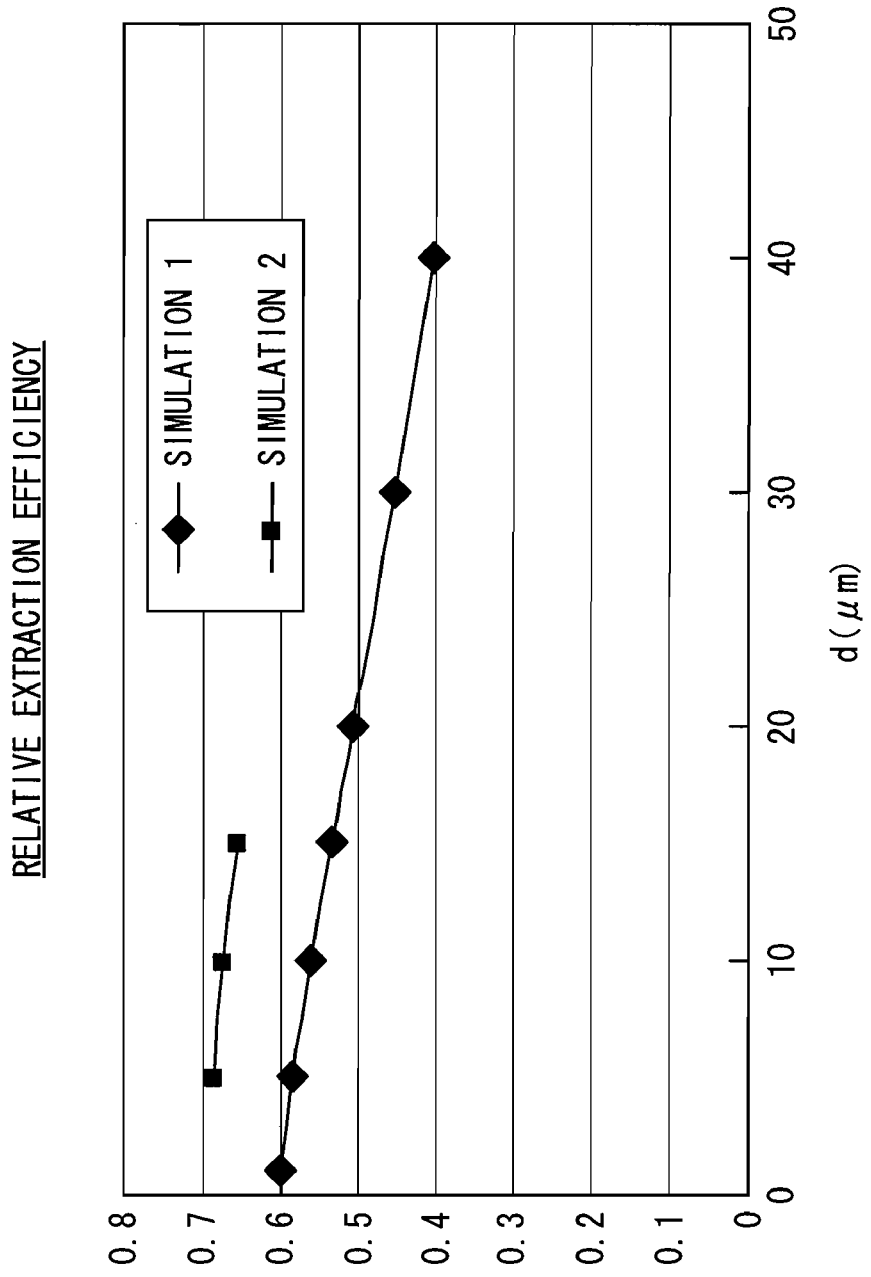
FIG. 13 is an illustration of relative light extraction efficiency in the simulations 1 and 2.

Simulation 2
1. Light source: Gauss
2. Reflector: CPC (Compound Parabolic Concentrator) Reflector In such configurations, in the case where the thickness d of the intermediate layer 46 was changed in stages within a range of 1 μm to 40 μm, the luminance of light emitted from the sealing substrate 21 with respect to a viewing angle was measured. FIG. 11 illustrates a luminance distribution in the simulation 1, and FIG. 12 illustrates a luminance distribution in the simulation 2. As the viewing angle, a front direction vertical to a substrate surface was 0°, and directions parallel to the substrate surface was −90° and 90°. Moreover, FIG. 13 illustrates relative light extraction efficiency in the simulations 1 and 2. The relative light extraction efficiency is a ratio of a measured light amount in the case where a light amount of light emitted from a light source 45 is 1.

As illustrated in FIG. 11, in the simulation 1, it was obvious that except for the front direction, in the case where the thickness d of the intermediate layer 46 was smaller, the luminance tended to increase. On the other hand, as illustrated in FIG. 12, in the simulation 2, a difference in luminance by the thickness d was hardly observed, but in the case where the thickness d was smaller, luminance was slightly improved. Moreover, as illustrated in FIG. 13, the relative light extraction efficiency tended to decrease with an increase in the thickness d. Therefore, it was confirmed from the above results that a reduction in the thickness between the reflector and the color filter as in the case of the embodiment contributed to an improvement in light extraction efficiency. Moreover, it was also confirmed that good viewing angle characteristics were exhibited.

Next, modifications of each projection in the reflector of the above-described embodiment will be described below. In the following description, like components are denoted by like numerals as of the light-emitting device 1 according to the above-described embodiment, and will not be further described.

Modification 1

Figure 14:
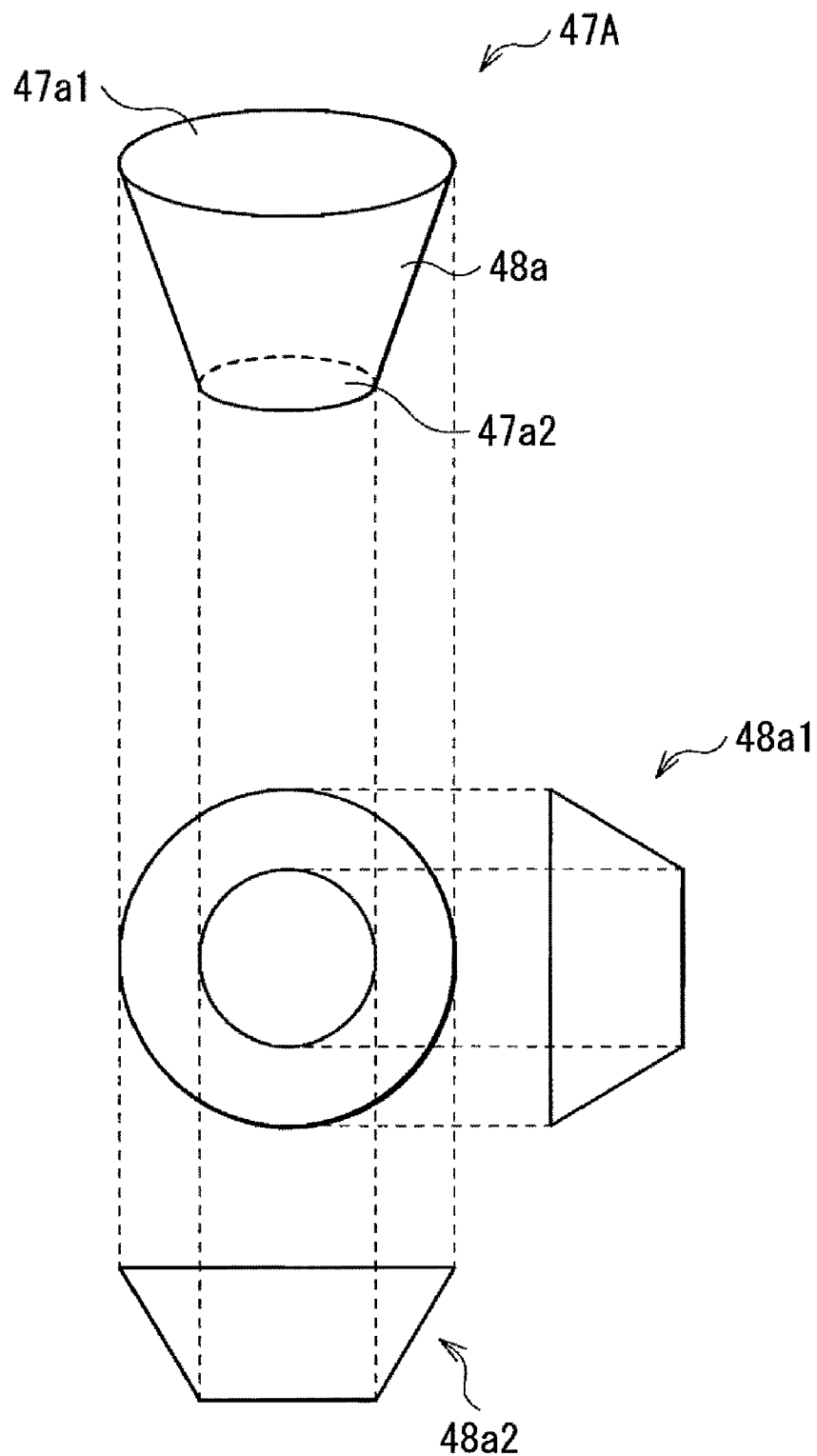
FIG. 14 is an illustration for describing the shape of a projection in Modification 1.

FIG. 14 describes the shape of a projection 47A of a reflector according to Modification 1. As illustrated in FIG. 14, the projection 47A has a side surface 48a, a lower base surface 47a1 and an upper base surface 47a2. The lower base surface 47a1 and the upper base surface 47a2 each have a circular planar shape. Moreover, in the projection 47A, side surface shapes 48a1, 48a2, . . . viewed from directions D1, D2, . . . in a substrate surface are equal to one another. However, in the modification, a taper part of each of the side surface shapes 48a1, 48a2, . . . is linear. In other words, the projection 47A has a truncated conical shape. Thus, the side surface of the projection 47A is not limited to the above-described paraboloidal shape, and may be a curved surface having a linear taper shape.

Modification 2

Figure 15C:
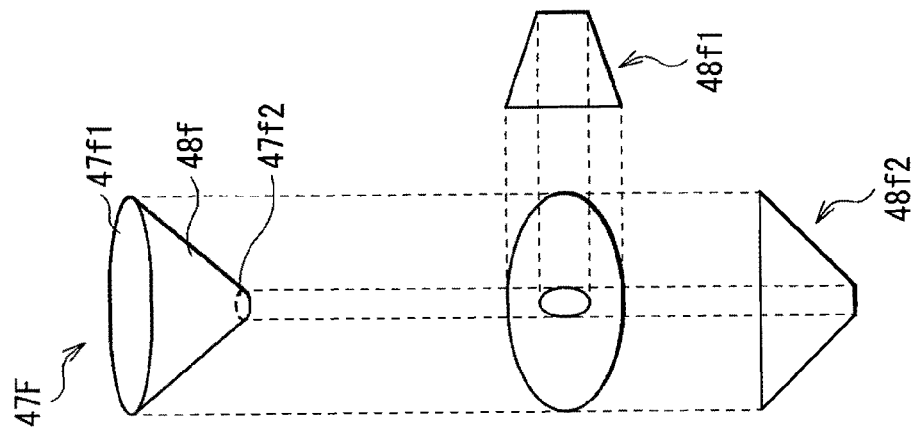
FIGS. 15A to 15C are illustrations for describing the shape of a projection in Modification 2.
Figure 15B:
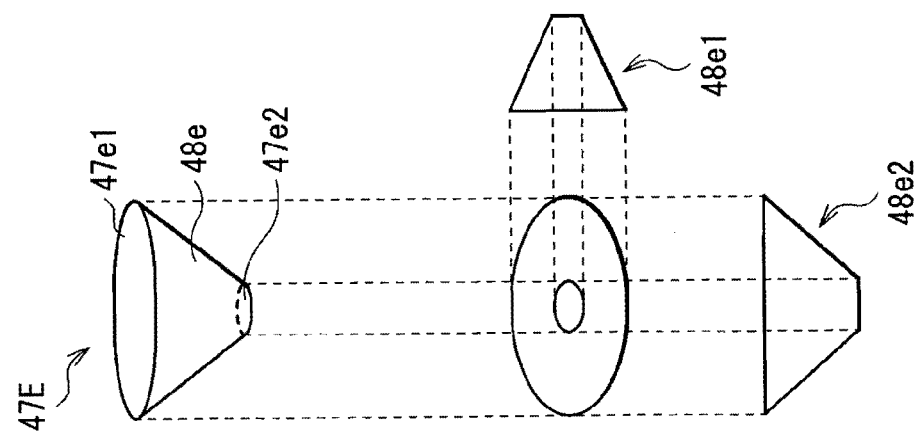
Figure 15A:
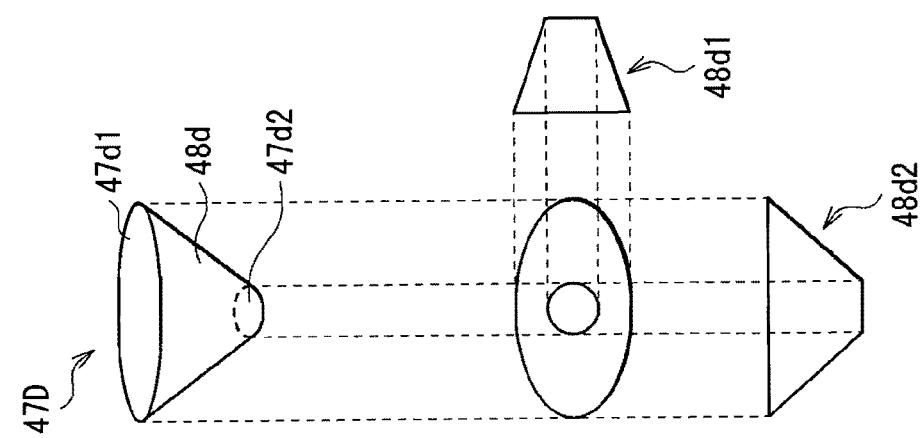

FIGS. 15A to 15C describe the shapes of projections 47D, 47E and 47F of a reflector according to Modification 2. As illustrated in FIGS. 15A to 15C, the projections 47D, 47E and 47F have side surfaces 48d, 48e and 48f having a linear taper shape, lower base surfaces 47d1, 47e1 and 47f1 and upper base surfaces 47d2, 47e2 and 47f2, respectively. Moreover, as in the case of the above-described projection 47A, side surface shapes 48d1 and 48d2, side surface shapes 48e1 and 48e2, and side surface shapes 48f1 and 48f2 viewed from two directions D1 and D2 orthogonal to each other in a substrate surface are different from each other.

However, in the projection 47D illustrated in FIG. 15A, the lower base surface 47d1 has an elliptical shape, and the upper base surface 47d2 has a circular shape. As described above, the lower base surface 47d1 and the upper base surface 47d2 may not have the same shape. Moreover, as in the case of the projection 47E illustrated in FIG. 15B, the lower base surface 47e1 and the upper base surface 47e2 may have elliptical planar shapes of which the long axis directions (the short axis directions) are oriented in the same direction. On the other hand, as in the case of the projection 47F illustrated in FIG. 15C, the lower base surface 47f1 and the upper base surface 47f2 may have elliptical planar shapes of which the long axis directions (the short axis directions) are orthogonal to each other.

Modification 3

Figure 16A:
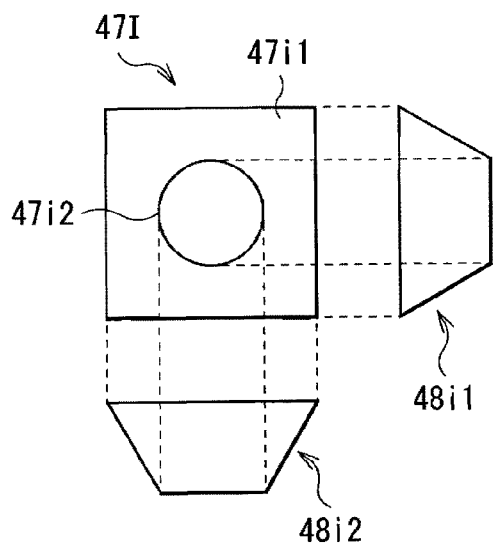
FIGS. 16A to 16D are illustrations for describing the shape of a projection in Modification 3.
Figure 16B:
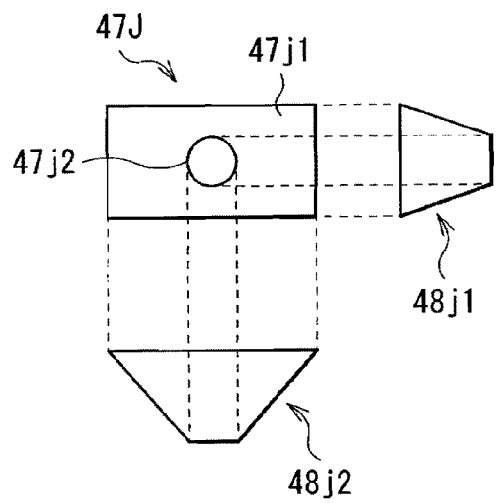

FIGS. 16A to 16D describe the shapes of projections 47I, 47J, 47K and 47M of a reflector according to Modification 3. As illustrated in FIG. 16A, in the projection 47I, an upper base surface 47i1 has a square planar shape, and the lower base surface 47i2 has a circular planar shape, and side surface shapes 48i1 and 48i2 viewed from the directions D1 and D2 are equal to each other. Moreover, as illustrated in FIG. 16B, in the projection 47J, an upper base surface 47j1 has a rectangular planar shape, and a the lower base surface 47j2 has a circular planar shape, and side surface shapes 48j1 and 48j2 viewed from the directions D1 and D2 are different from each other.

Figure 16C:
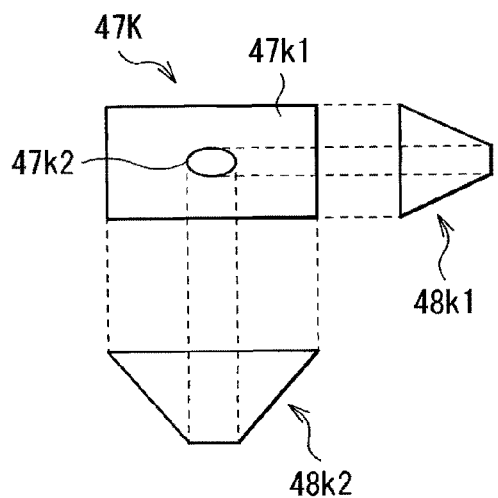
Figure 16D:
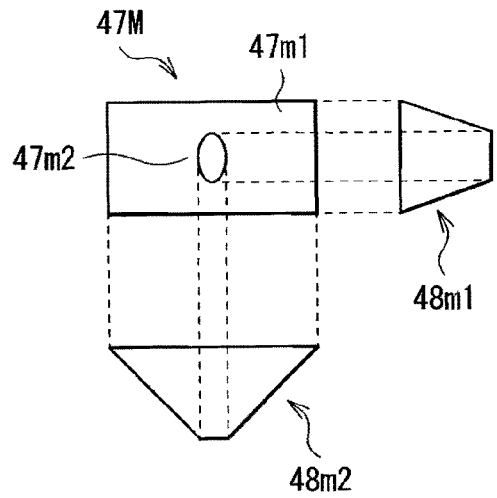

As illustrated in FIGS. 16C and 16D, in the projections 47K and 47M, upper base surfaces 47k1 and 47m1 each have a rectangular planar shape, and lower base surfaces 47k2 and 47m2 each have an elliptical planar shape, and side surface shapes 48k1 and 48k2 and side surface shapes 48m1 and 48m2 viewed from the directions D1 and D2 are different from each other. However, in the projection 47K, the longitudinal direction of the upper base surface 47k1 and the long axis of the lower base surface 47k2 are parallel to each other. On the other hand, in the projection 47M, the longitudinal direction of the upper base surface 47m1 and the long axis of the lower base surface 47m2 are orthogonal to each other. As described above, various combinations of the side surface shape and the planar shapes of the upper base surface and the lower base surface in the projection are applicable. Thereby, emission characteristics of the reflector are freely adjustable.

In addition, the side surface of each of the projections in the embodiment and Modifications 1 to 3 is not limited to a paraboloidal surface, a conical curved surface, a cylindrical curved surface or the like, and may be any other curved surface such as a spherical surface or an aspherical surface. Moreover, the planar shape of each projection is not limited to a circular shape, an elliptical shape, a square shape and a rectangular shape, and may be a polygonal shape such as a triangular shape or a pentagonal shape.

MODULE AND APPLICATION EXAMPLES

Application examples of the light-emitting devices described in the above-described embodiment and the above-described modifications will be described below. The light-emitting device according to the above-described embodiment is applicable to displays of electronic devices displaying a picture signal inputted from outside or a picture signal produced inside as an image or a picture in any fields, such as televisions, digital cameras, notebook personal computers, portable terminal devices such as cellular phones, and video cameras.

Modules

Figure 17:
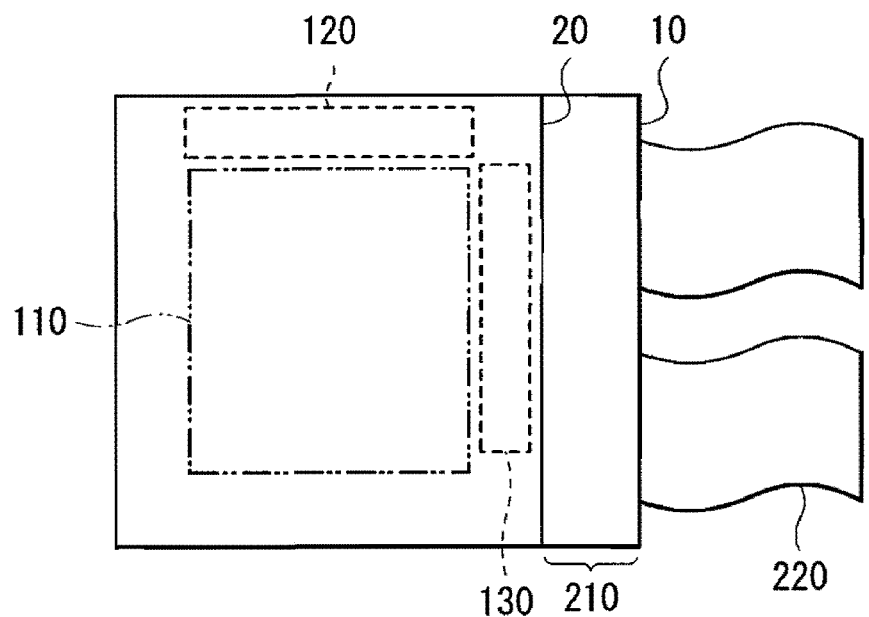
FIG. 17 is a schematic plan view of a module including the light-emitting device according to the above-described embodiment.

The light-emitting device according to the above-described embodiment or the like is incorporated into various electronic devices such as Application Examples 1 to 5 which will be described later as a module as illustrated in FIG. 17. In the module, for example, a region 210 exposed from the sealing panel 20 is arranged on a side of the drive substrate 11, and an external connection terminal (not illustrated) is formed in the exposed region 210 by extending the wiring of the signal line drive circuit 120 and the scanning line drive circuit 130. In the external connection terminal, a flexible printed circuit (FPC) 220 for signal input/output may be arranged.

Application Example 1

Figure 18:
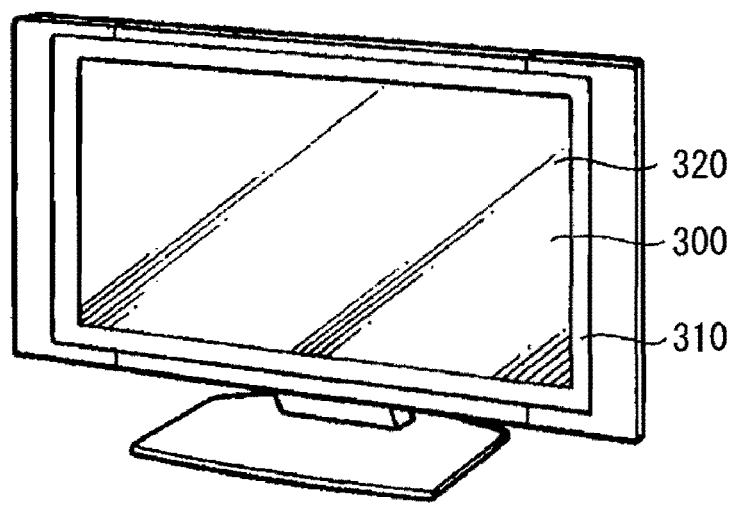
FIG. 18 is an external perspective view of Application Example 1 of the light-emitting device according to the above-described embodiment.

FIG. 18 illustrates an appearance of a television to which the light-emitting device according to the above-described embodiment or the like is applied. The television has, for example, a picture display screen section 300 including a front panel 310 and a filter glass 320. The picture display screen section 300 is configured of the light-emitting device according to the above-described embodiment or the like.

Application Example 2

Figure 19A:
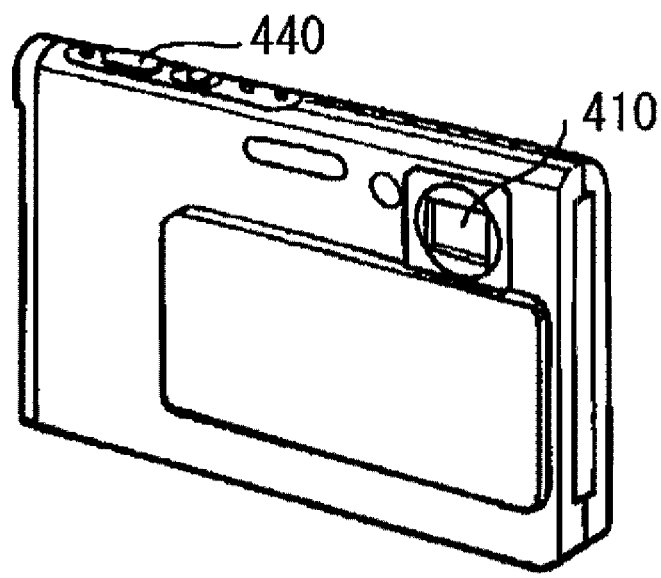
FIGS. 19A and 19B are an external perspective view from the front side of Application Example 2 and an external perspective view from the back side of Application Example 2, respectively.
Figure 19B:
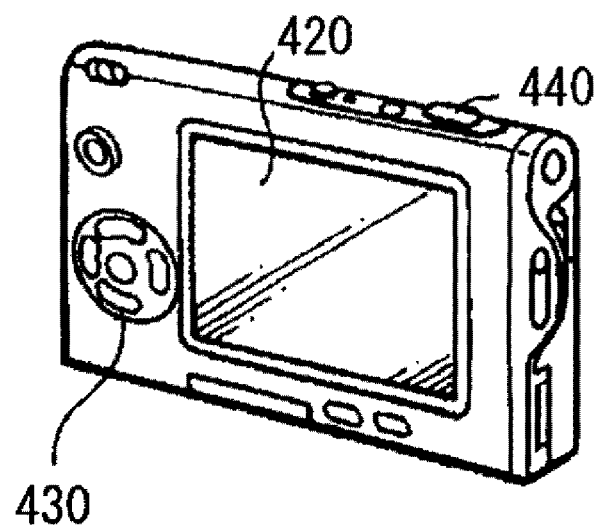

FIGS. 19A and 19B illustrate appearances of a digital camera to which the light-emitting device according to the above-described embodiment or the like is applied. The digital camera has, for example, a light-emitting section for a flash 410, a display section 420, a menu switch 430, and a shutter button 440. The display section 420 is configured of the light-emitting device according to the embodiment or the like.

Application Example 3

Figure 20:
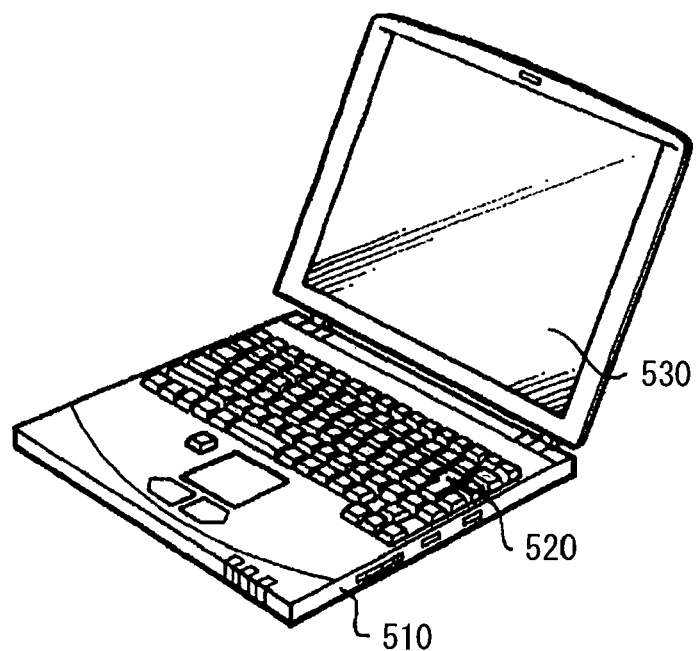
FIG. 20 is an external perspective view of Application Example 3.

FIG. 20 illustrates an appearance of a notebook personal computer to which the light-emitting device according to the above-described embodiment or the like is applied. The notebook personal computer has, for example, a main body 510, a keyboard 520 for operation of inputting characters and the like, and a display section 530 for displaying an image. The display section 530 is configured of the light-emitting device according to the above-described embodiment or the like.

Application Example 4

Figure 21:
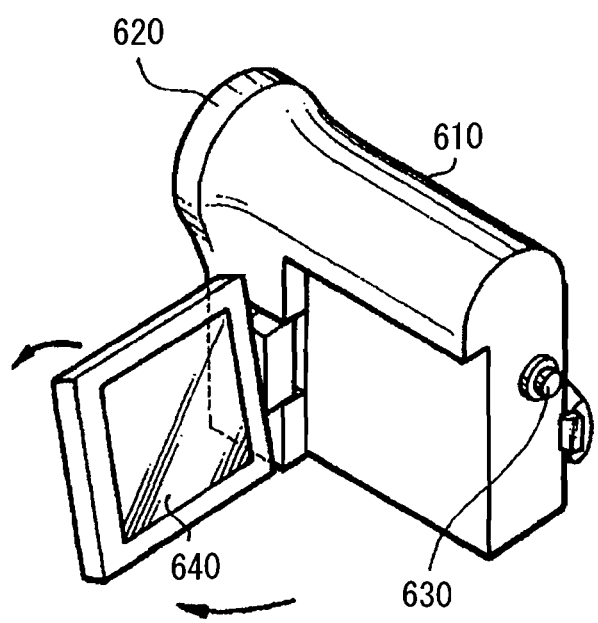
FIG. 21 is an external perspective view of Application Example 4.

FIG. 21 illustrates an appearance of a video camera to which the light-emitting device according to the above-described embodiment or the like is applied. The video camera has, for example, a main body 610, a lens for shooting an object 620 arranged on a front surface of the main body 610, a shooting start/stop switch 630, and a display section 640. The display section 640 is configured of the light-emitting device according to the above-described embodiment or the like.

Application Example 5

FIGS. 22A to 22G illustrate appearances of a cellular phone to which the light-emitting device according to the above-described embodiment or the like is applied. The cellular phone is formed by connecting, for example, a top-side enclosure 710 and a bottom-side enclosure 720 to each other by a connection section (hinge section) 730. The cellular phone has a display 740, a sub-display 750, a picture light 760, and a camera 770. The display 740 or the sub-display 750 is configured of the light-emitting device according to the above-described embodiment or the like.

Although the present invention is described referring to the embodiment, the invention is not limited thereto, and may be variously modified. For example, the material and thickness of each layer, the method and conditions of forming each layer are not limited to those described in the above-described embodiment, and each layer may be made of any other material with any other thickness by any other method under any other conditions.

Moreover, in the above-described embodiment or the like, when the reflector 40 is formed, the stamper for transfer is formed by forming the reverse pattern of the projections 41 on the polycarbonate master by a mask imaging method. However, a method of forming the stamper is not limited thereto. For example, the following methods (1) to (4) may be used. In addition, a resin material used for the base 41 depends on the material of the used stamper. For example, in the case where a Zeonor (trademark) stamper in the method (2) is used, the Zeonor (trademark) stamper has a good peeling property from resins, so various kinds of UV curable resins are used.

(1) Method of obtaining a nickel (Ni) electroforming stamper by forming nickel electroforming with a polycarbonate master (2) Method of obtaining a Zeonor (trademark) stamper by thermally transferring a pattern to a Zeonor (trademark) film with a Ni electroforming stamper (3) Method of directly forming a pattern on a substrate made of polycarbonate, metal or the like as a stamper by cutting by a cutting tool, a focused laser or the like (4) Method of directly forming a pattern on a substrate as a stamper by a photolithography technique Further, in the above-described embodiment or the like, the configurations of the organic EL elements 10R, 10B and 10G are specifically described. However, all layers are not necessarily included, or any other layer may be further included.

The present application is applicable to not only the organic EL element but also any other self-luminous element such as an LED (Light Emitting Diode), an FED (Field Emission Display) or an inorganic electroluminescence element.

Further, in the above-described embodiment or the like, the case where the light-emitting device is applied to a display is described. However, the light-emitting device is applicable to any light-emitting device for any purpose other than the display, such as a lighting device.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A color filter comprising:
 a plurality of color filter layers for a plurality of colors arranged on a substrate,
 a plurality of projections arranged in direct contact with the color filter layers, the projections of which parts on a side closer to the color filter layers are connected to one another; and
 a reflecting mirror film formed so as to be laid over a side surface of each of the plurality of projections.

2. The color filter according to claim 1, wherein
 side surface shapes in all directions of each of the projections are equal to one another.

3. The color filter according to claim 1, wherein
 a side surface of each of the projections is a paraboloidal surface.

4. The color filter according to claim 1, wherein
 side surface shapes viewed from two directions orthogonal to each other of each of the projections are different from each other.

5. The color filter according to claim 1, wherein
 a plane area on a side closer to the color filter layers of each of the projections is equal to or smaller than an opening area of each of the color filter layers.

6. A method of manufacturing a color filter comprising:
 forming a plurality of projections on and directly contacting surfaces of a plurality of color filter layers for a plurality of colors formed on a substrate so that parts on a side closer to the color filter layers of the plurality of projections are connected to one another; and
 forming a reflecting mirror film on a side surface of each of the plurality of projections.

7. The method of manufacturing a color filter according to claim 6, wherein
 the plurality of projections are formed so that side surface shapes in all directions of each of the projections are equal to one another.

8. The method of manufacturing a color filter according to claim 6, wherein
 a side surface of each of the projections is a paraboloidal surface.

9. The method of manufacturing a color filter according to claim 6, wherein
 the plurality of projections are formed so that side surface shapes viewed from two directions orthogonal to each other of each of the projections are different from each other.

10. The method of manufacturing a color filter according to claim 6, wherein
 a plane area on a side closer to the color filter layers of each of the projections is equal to or smaller than an opening area of each of the color filter layers.

11. A light-emitting device comprising:
 a drive panel including a plurality of self-luminous elements and a drive element driving the plurality of self-luminous elements; and
 a sealing panel arranged so as to face the drive panel,
 wherein the sealing panel includes:
 a substrate,
 a plurality of color filter layers for a plurality of colors arranged on the substrate,
 a plurality of projections arranged in direct contact with the color filter layers, the projections of which parts on a side closer to the color filter layers are connected to one another; and
 a reflecting mirror film formed so as to be laid over a side surface of each of the plurality of projections.

12. The light-emitting device according to claim 11, wherein
 side surface shapes in all directions of each of the projections are equal to one another.

13. The light-emitting device according to claim 11, wherein
 a side surface of each of the projections is a paraboloidal surface.

14. The light-emitting device according to claim 11, wherein
 side surface shapes viewed from two directions orthogonal to each other of each of the projections are different from each other.

15. The light-emitting device according to claim 11, wherein
 a plane area on a side closer to the color filter layers of each of the projections is equal to or smaller than an opening area of each of the color filter layers.

* * * * *